(12) United States Patent
Saito et al.

(10) Patent No.: US 7,166,861 B2
(45) Date of Patent: Jan. 23, 2007

(54) THIN-FILM TRANSISTOR AND METHOD FOR MANUFACTURING THE SAME

(75) Inventors: Wataru Saito, Tokyo-to (JP); Yudai Yamashita, Tokyo-to (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 10/761,847

(22) Filed: Jan. 21, 2004

(65) Prior Publication Data

US 2004/0232495 A1 Nov. 25, 2004

(30) Foreign Application Priority Data

Jan. 23, 2003 (JP) ............... 2003-015392

(51) Int. Cl.
| | |
|---|---|
| *H01L 29/04* | (2006.01) |
| *H01L 29/10* | (2006.01) |
| *H01L 31/20* | (2006.01) |
| *H01L 31/036* | (2006.01) |
| *H01L 31/0376* | (2006.01) |

(52) U.S. Cl. ............ 257/57; 257/58; 257/59; 257/66; 257/67; 257/68; 257/69; 257/70; 257/71; 257/72; 257/73; 257/291; 257/292; 257/293; 257/294; 257/330; 257/331; 257/332; 257/333; 257/334; 257/359; 257/401; 257/618; 257/622; 257/623; 257/626

(58) Field of Classification Search ........ 257/57–59, 257/66–73, 291–294, 359, 330–334, 401, 257/618, 622, 623, 626
See application file for complete search history.

(56) References Cited

U.S. PATENT DOCUMENTS

| | | | | |
|---|---|---|---|---|
| 5,134,448 A | * | 7/1992 | Johnsen et al. ............. 257/330 |
| 5,377,031 A | * | 12/1994 | Vu et al. ..................... 349/45 |
| 5,494,837 A | * | 2/1996 | Subramanian et al. ...... 438/149 |
| 5,693,549 A | * | 12/1997 | Kim ........................... 438/157 |
| 6,037,635 A | * | 3/2000 | Yamazaki ................... 257/353 |

(Continued)

FOREIGN PATENT DOCUMENTS

JP 06132537 A * 5/1994

*Primary Examiner*—Ida M. Soward
(74) *Attorney, Agent, or Firm*—Ladas & Parry LLP

(57) ABSTRACT

The present invention provides a thin-film transistor that is formed by using a patterning method capable of forming a semiconductor channel layer in sub-micron order and a method for manufacturing thereof that provides a thin-film transistor with a larger area, and suitable for mass production. These objects are achieved by a thin-film transistor formed on a substrate 1 with a finely processed concavoconvex surface 2, in which a source electrode and a drain electrode are formed on adjacent convex portions of the concavoconvex surface 2, with a channel and a gate being formed on a concave area between the convex portions. A gate electrode 5, a gate insulating film 6 and a semiconductor channel layer 7 are laminated in this order on the concave area from the bottom surface of the concave portion toward the top surface. Preferably, in this thin-film transistor, the concavoconvex surface is formed of a curing resin, a semiconductor constituting a thin-film transistor is formed of a semiconductor such as polycrystal silicon or an organic semiconductor material, and the substrate is formed of glass, plastic or a composite material of these materials.

13 Claims, 14 Drawing Sheets

U.S. PATENT DOCUMENTS

| | | | |
|---|---|---|---|
| 6,057,555 A * | 5/2000 | Reedy et al. | 257/9 |
| 6,087,692 A * | 7/2000 | Gobel et al. | 257/300 |
| 6,309,930 B1 * | 10/2001 | Goebel et al. | 438/270 |
| 6,525,340 B1 * | 2/2003 | Colavito et al. | 257/57 |
| 6,717,200 B1 * | 4/2004 | Schamberger et al. | 257/302 |
| 6,784,453 B1 * | 8/2004 | Miyazaki et al. | 257/49 |
| 6,847,064 B1 * | 1/2005 | Zhang et al. | 257/213 |
| 2002/0151136 A1 * | 10/2002 | Lin et al. | 438/259 |
| 2003/0080337 A1 * | 5/2003 | Yudasaka et al. | 257/59 |
| 2003/0132482 A1 * | 7/2003 | Miyazaki et al. | 257/347 |

* cited by examiner

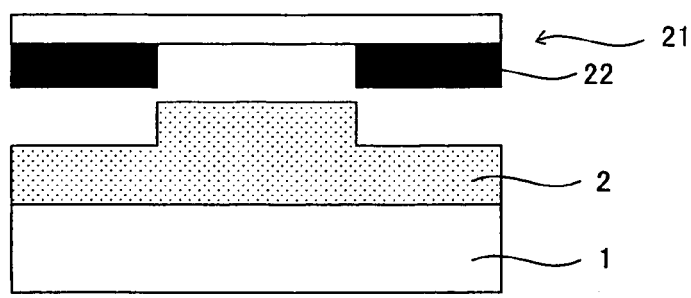
FIG. 10A
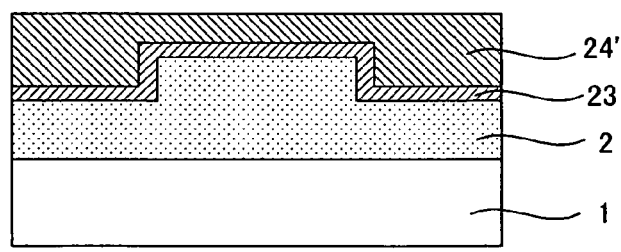
FIG. 10B
FIG. 10C
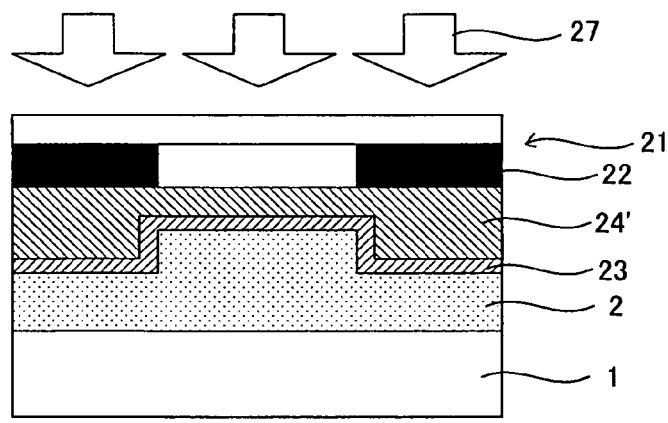
FIG. 10D
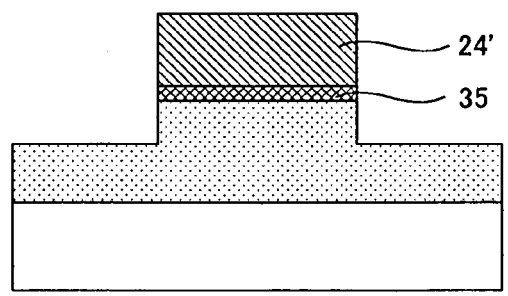
FIG. 10E
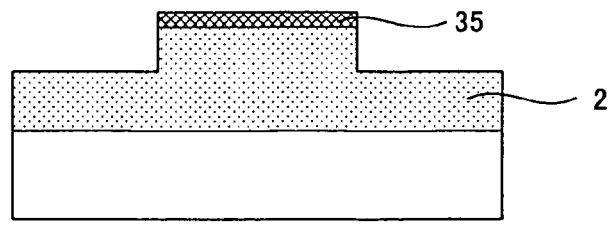

THIN-FILM TRANSISTOR AND METHOD FOR MANUFACTURING THE SAME

BACKGROUND OF THE INVENTION

1. Field of the Invention

The present invention relates to a field-effect type thin-film transistor in which a thin film semiconductor and an insulating material are formed on a substrate with a concavoconvex surface, and a method for manufacturing the same.

2. Description of the Related Art

In general, upon manufacturing a thin-film transistor (TFT), an exposing device for transferring a necessary pattern onto a substrate is used. This exposing device is constituted by an exposing optical system for transferring a fine pattern onto a substrate, an alignment system that positions a mask and the substrate with high precision, and an automatic transporting system that automatically transports the mask and the substrate. Prior to an exposing process in which such an exposing device is used, a resist thin film having predetermined photosensitivity is formed on the substrate.

In recent years, with respect to liquid crystal apparatuses, various attempts are being made to achieve high performances of the liquid crystal apparatus by providing high definition in the display accuracy and a low power-consumption driving process. As the performances of the liquid crystal apparatus become higher, the precision of TFT formed on the liquid crystal display has been improved to a sub-micron level (<1 μm), with the result that demands for fine patterning on wide area is increasing.

In order to achieve such fine patterning, an exposing technique which meets the necessary degree of precision is required indispensably, however, an exposing device and an exposing technique with resolution which completely satisfy such a degree of precision have not been completed from the viewpoint of throughputs, and superior techniques need to be developed.

Moreover, the integration of the DRAM that is a typical example of LSI in being improved in a remarkable degree, that is, four times in these three years. Accordingly, the miniaturization of the integrated circuit pattern is being improved, and there are practical needs for line-width processing precision of not more than 130 nm.

Under these circumstances, as an example of a fine-patterning technique generally used as a pattern-forming technique, a photolithography technique (for example, see "Flat Panel Display '91", Setsuo USUI, published by Nikkei Business Publications, Inc., 1991, p.117–128) can be listed. As a fine-patterning technique for small quantity, large variety products, a direct-drawing technique and the like using an electron beam can be listed.

However, the above mentioned fine-patterning techniques have respective problems. For example, in the photolithography technique, there is a limitation in the resolution in association with the light wavelength, and the problem that transferring and exposing in a scale of not more than 100 nm are difficult has been pointed out (for example, see Journal of Japan Society of Grinding Engineers, by TANIGUCHI et al., published in 2002 vol. 46, issue 6, p. 282–285). Moreover, in the direct drawing technique using an electron beam, it has been recognized that the throughput per unit time is insufficient, and is not suitable for mass production.

On the other hand, "Flat Panel Display '91", Setsuo USUI, published by Nikkei Business Publications, Inc., 1991, p. 117–128 introduces a nano-imprint lithography technique as a fine-patterning technique capable of climbing out of the limitation of resolution in the above mentioned photolithography technique. This nano-imprint lithography technique is a technique in which: thermoplastic PMMA (polymethylmethacrylate) is provided to a pattern transferring layer on a silicon substrate, and a mold that has been preliminarily patterned is pressed onto the pattern transferring layer so that a fine concavoconvex pattern is formed on the PMMA resin layer. Thereafter, forming of a wiring pattern by forming Al or the like is being studied. Moreover, Japanese Patent Application Laid-Open No. 11-204742 discloses a technique in which a desired concavoconvex pattern is formed by transferring concavoconvex of a stamp by using a 2P (Photo-Polymerized) method, which is a technique similar to the nano-imprint lithography technique.

However, the above mentioned nano-imprint lithography technique and techniques similar thereto are still under development, and have not been fully researched, and in particular, with respect to the field-effect type thin-film transistor and method for manufacturing thereof, there are no examples of the research and practical application.

SUMMARY OF THE INVENTION

The present invention is achieved to solve the above mentioned problems with the photolithography technique and direct drawing technique using an electron beam, and its object is to provide a thin-film transistor manufactured by using a patterning method capable of forming semiconductor channel layers in the sub-micron order, and a method for manufacturing thereof that provides a thin-film transistor with a larger area, and suitable for mass production.

In order to achieve the above mentioned object, a first invention of a thin-film transistor is a thin-film transistor formed on a substrate with a concavoconvex surface, on which: a source electrode and a drain electrode are formed on adjacent convex portions of the concavoconvex surface; and a semiconductor channel layer and a gate electrode are formed on a concave area between the convex portions.

The thin-film transistor of the first invention preferably includes the following embodiments: (i) an embodiment in which, in the concave area, a gate electrode, a gate insulating film and a semiconductor channel layer are laminated in this order on the bottom surface of the concave portion; and (ii) an embodiment in which, in the concave area, a semiconductor channel layer, a gate insulating film and a gate electrode are laminated in this order on the bottom surface of the concave portion.

Moreover in order to achieve the above mentioned object, a second invention of a thin-film transistor is a thin-film transistor formed on a substrate with a concavoconvex surface, on which: either one of a source electrode or a drain electrode is formed on a top surface of the convex portion of the concavoconvex surface; a semiconductor channel layer and a gate electrode are formed on a side surface area connecting to the top surface of the convex portion; remaining one of the source electrode or the drain electrode is formed on a bottom surface of a concave portion connecting to the side surface area of the convex portion.

Further, in order to achieve the above mentioned object, a third invention of a thin-film transistor is a thin-film transistor formed on a substrate with a concavoconvex surface, on which: a semiconductor channel layer, a gate insulating film and a gate electrode are laminated on the convex portion of the concavoconvex surface in this order;

and a source electrode and a drain electrode are respectively formed on bottom surfaces of both sides of the convex portion.

Here, the thin-film transistor of the first to third inventions preferably includes the following modes: (1) a mode in which the concavoconvex surface is formed of a curing resin, (2) a mode in which the semiconductor that forms the thin-film transistor is formed of polycrystal silicon or organic semiconductor material and (3) a mode in which the substrate is formed of a glass material, a plastic material or a composite material of these materials.

In order to achieve the above mentioned object, a first method for manufacturing a thin-film transistor of the invention is a method for manufacturing a thin-film transistor formed by forming a source electrode and a drain electrode on adjacent convex portions of a concavoconvex surface of a substrate with a concavoconvex surface, and laminating a gate electrode, a gate insulating film and a semiconductor channel layer in this order on a bottom surface of a concave area between the convex portions, comprising: (1) preparing a substrate and a concavoconvex surface forming substrate on which a concavoconvex pattern is formed; (2) after sandwiching a curing resin composition by the two substrates, curing the composition and demolding the concavoconvex surface forming substrate to form a substrate with a concavoconvex surface; (3) after forming a conductive thin film over the entire surface of the concavoconvex surface, further forming a positive type resist film thereon so that the concavoconvex surface is flattened; (4) exposing and developing the resist film by using a mask having the same concavoconvex pattern as the concavoconvex surface forming substrate, to bare the conductive thin film on the top surfaces of the convex portions; (5) forming an impurity containing amorphous silicon thin film over the entire surface that has been bared; (6) removing the resist film and the impurity containing amorphous silicon thin film remaining in the concave areas by exposing and developing from the front side of the substrate; (7) etching the bared conductive thin film; (8) forming an amorphous silicon thin film over the entire surface of the substrate after the etching; (9) carrying out a laser annealing process to form a semiconductor channel layer formed of polysilicon, as well as crystallizing the impurity containing amorphous silicon thin film on the top surfaces of the convex portion to form a source side diffusion layer and a drain side diffusion layer formed of low resistance polysilicon; (10) forming a gate insulating film on the semiconductor channel layer, the source side diffusion layer and the drain side diffusion layer; and (11) forming a gate electrode on the gate insulating film of the upper portion of the semiconductor channel layer.

In order to achieve the above mentioned object, a second method for manufacturing a thin-film transistor of the invention is a method for manufacturing a thin-film transistor formed by forming a source electrode and a drain electrode on adjacent convex portion of a concavoconvex surface of a substrate with a concavoconvex surface, and laminating a semiconductor channel layer, a gate insulating film and a gate electrode in this order on a bottom surface of a concave area between the convex portions, comprising: (1) preparing a substrate and a concavoconvex surface forming substrate on which a concavoconvex pattern is formed; (2) after sandwiching a curing resin composition by the two substrates, curing the composition and demolding the concavoconvex surface forming substrate to form a substrate with a concavoconvex surface; (3) after forming an impurity containing amorphous silicon thin film over the entire surface of the concavoconvex surface, further forming a negative type resist film thereon so that the concavoconvex surface is flattened; (4) exposing and developing the resist film by using a mask having the same concavoconvex pattern as the concavoconvex surface forming substrate, to bare the impurity containing amorphous silicon thin film on the concave area; (5) etching the bared impurity containing amorphous silicon thin film; (6) removing the resist film remaining on the top surfaces of the convex portions; (7) forming an amorphous silicon thin film on a predetermined area; (8) carrying out a laser annealing process to form a semiconductor channel layer formed of polysilicon on the concave area, as well as crystallizing the impurity containing amorphous silicon thin film on the top surfaces of the convex portions on both sides of the concave portion to form a source side diffusion layer and a drain side diffusion layer formed of low resistance polysilicon; (9) forming a gate insulating film over the entire surface; and (10) after forming a contact hole in the gate insulating film, forming a conductive thin film to form a source electrode, a gate electrode and a drain electrode.

In order to achieve the above mentioned object, a third method for manufacturing a thin-film transistor of the invention is a method for manufacturing a thin-film transistor formed by forming either one of a source electrode or a drain electrode on a top surface of a convex portions of a concavoconvex surface of a substrate with a concavoconvex surface, forming a semiconductor channel layer and a gate electrode on a side surface area connecting to the top surface of the convex portion, forming the remaining one of the source electrode or the drain electrode on a bottom surface of a concave portion connecting to the side surface area of the convex portion, comprising: (1) preparing a substrate and a concavoconvex surface forming substrate on which a concavoconvex pattern is formed; (2) after sandwiching a curing resin composition by the two substrates, curing the composition and demolding the concavoconvex surface forming substrate to form a substrate with a concavoconvex surface; (3) after forming a conductive thin film over the entire surface of the concavoconvex surface, further forming an impurity containing amorphous silicon thin film thereon, and further forming a positive type resist film thereon so that the concavoconvex surface is flattened; (4) after positioning a photomask, having an opening portion which is a size similar to the film thickness of the conductive thin film and the impurity containing amorphous silicon thin film that are formed on the side surface area of a step portion of the concavoconvex surface, on the side surface area on the positive type photoresist film to be made in contact therewith, exposing and developing from the photomask side to remove the resist film on the side surface area; (5) etching to remove the bared impurity containing amorphous silicon thin film and the conductive thin film; (6) removing the resist film on the concavoconvex surface; (7) forming an amorphous silicon thin film on a predetermined area including the side surface area; (8) carrying out a laser annealing process to form a semiconductor channel layer formed of polysilicon on the side surface area, as well as crystallizing the impurity containing amorphous silicon thin film of the top surfaces of the convex portions and bottom surface of the concave portion connecting to the side surface area to form a source side diffusion layer and a drain side diffusion layer formed of low resistance polysilicon; (9) forming a gate insulating film on the crystallized polysilicon; and (10) forming a gate electrode on the gate insulating film.

In order to achieve the above mentioned object, a fourth method for manufacturing a thin-film transistor of the invention is a method for manufacturing a thin-film transistor formed by laminating a semiconductor channel layer, a gate insulating film and a gate electrode in this order on a convex portions of a concavoconvex surface of a substrate with a concavoconvex surface, and forming a source electrode and a drain electrode respectively on a bottom surface of both sides of the concave area between the convex portions, comprising: (1) preparing a substrate and a concavoconvex surface forming substrate on which a concavoconvex pattern is formed; (2) after sandwiching a curing resin composition by the two substrates, curing the composition and demolding the concavoconvex surface forming substrate to form a substrate with a concavoconvex surface; (3) after laminating a conductive thin film and an impurity containing amorphous silicon thin film over the entire surface of the concavoconvex surface, further forming a positive type resist film so that the concavoconvex surface is flattened; (4) exposing and developing the resist film by using a mask having the same concavoconvex pattern as the concavoconvex surface forming substrate, to bare the impurity containing amorphous silicon thin film on the top surfaces of the convex portions; (5) removing the impurity containing amorphous silicon thin film and the conductive thin film bared by an etching; (6) removing the resist film on the concavoconvex surface; (7) forming an amorphous silicon thin film on a predetermined area including the top surfaces of the convex portions; (8) carrying out a laser annealing process to form a semiconductor channel layer formed of polysilicon on the top surfaces of the convex portions, as well as crystallizing the impurity containing amorphous silicon thin film formed on concave areas on both sides of the top surface of the convex portion to form a source side diffusion layer and a drain side diffusion layer formed of low resistance polysilicon; (9) forming a gate insulating film on the crystallized polysilicon; and (10) forming a gate electrode on the gate insulating film.

In order to achieve the above mentioned object, a fifth method for manufacturing a thin-film transistor of the invention is a method for manufacturing for a thin-film transistor formed by laminating a semiconductor channel layer, a gate insulating film and a gate electrode in this order on a convex portion of a concavoconvex surface of a substrate with a concavoconvex surface, and forming a source electrode and a drain electrode formed respectively on bottom surface on both sides of the convex portion, comprising: (1) preparing a substrate and a concavoconvex surface forming substrate on which a concavoconvex pattern is formed; (2) after sandwiching a curing resin composition by the two substrates, curing the composition and demolding the concavoconvex surface forming substrate to form a substrate with a concavoconvex surface; (3) after laminating a conductive thin film over the entire surface of the concavoconvex surface, further forming a negative type resist film thereon so that the concavoconvex surface is flattened; (4) exposing and developing the resist film by using a mask having the same concavoconvex pattern as the concavoconvex surface forming substrate, to bare the conductive thin film on the concave portion; (5) removing the conductive thin film bared by an etching; (6) removing the resist film on the concavoconvex surface; (7) forming agate insulating film over the entire surface thereof; (8) forming an amorphous silicon thin film on the gate insulating film, and further forming an impurity containing amorphous silicon thin film on the amorphous silicon thin film; (9) carrying out a laser annealing process to form a semiconductor channel layer formed of polysilicon on the top surfaces of the convex portions, as well as crystallizing the impurity containing amorphous silicon thin film formed on concave areas on both sides of the top surface of the convex portion to form a source side diffusion layer and a drain side diffusion layer formed of low resistance polysilicon; and (10) forming a source electrode on the source side diffusion layer, and forming a drain electrode on the drain side diffusion layer.

Different from a conventional TFT manufacturing method using a generally-used photolithography technique, by the methods for manufacturing according to the first to fifth inventions, since a concavoconvex surface formed of a curing resin is formed on a substrate by using a concavoconvex surface forming substrate to the substrate, and the concave portion of the concavoconvex surface is used as a TFT semiconductor channel layer, it is possible to equalize and refine the semiconductor channel layer by improving the degree of precision of the concavoconvex surface using the concavoconvex surface forming substrate. Consequently, it becomes possible to easily manufacture a thin-film transistor having a semiconductor channel layer in the sub-micron order, and also to provide a method for manufacturing that achieves a thin-film transistor with a larger area, and suitable for mass production.

As described above, according to the thin-film transistor of the present invention, since the concavoconvex surface is formed with minute structure, it is possible to provide extremely fine thin-film transistor utilizing the concavoconvex shape. Moreover, since the elements constituting the thin-film transistor of the present invention can be varied within the range of the fine shape of the concavoconvex surface, it is possible to provide extremely fine thin-film transistor.

According to the method for manufacturing the thin-film transistor of the present invention, different from a conventional TFT manufacturing method using a generally-used photolithography technique, since a concavoconvex surface formed of a curing resin is formed on a substrate by using a concavoconvex surface forming substrate to the substrate, and the concave portion of the concavoconvex surface is used as a TFT semiconductor channel layer, it is possible to equalize and refine the semiconductor channel layer, by improving the degree of precision of the concavoconvex surface using the concavoconvex surface forming substrate. Consequently, it becomes possible to easily manufacture a thin-film transistor having a semiconductor channel layer in the sub-micron order, and also to provide a method for manufacturing that achieves a thin-film transistor with a larger area, and suitable for mass production.

BRIEF DESCRIPTION OF THE DRAWINGS

FIGS. 10A to 10K are process drawings that show a fifth example of a method for manufacturing the thin-film transistor of the present invention.

DESCRIPTION OF THE PREFERRED EMBODIMENT

Figure 1:
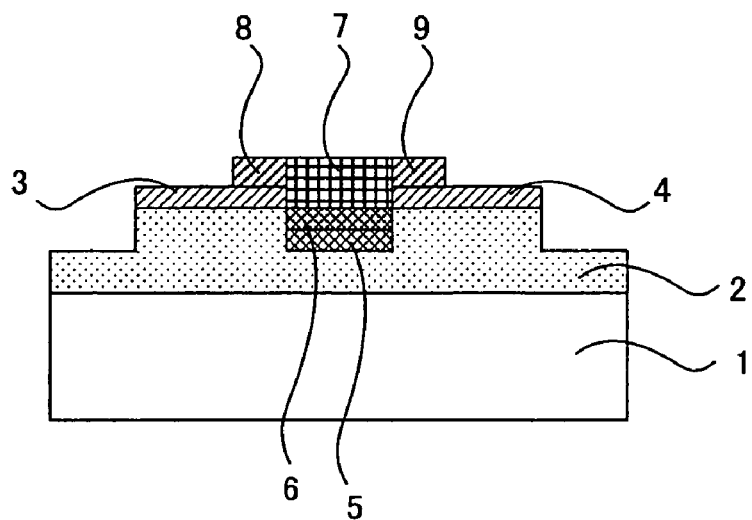
FIG. 1 is a cross-sectional view that shows one example of a thin-film transistor of a first embodiment of the present invention.
Figure 2:
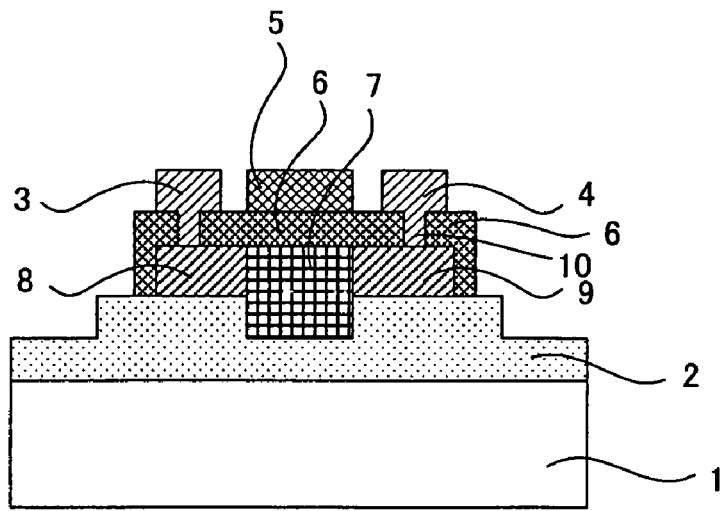
FIG. 2 is a cross-sectional view that shows one example of a thin-film transistor of a second embodiment of the present invention.
Figure 3:
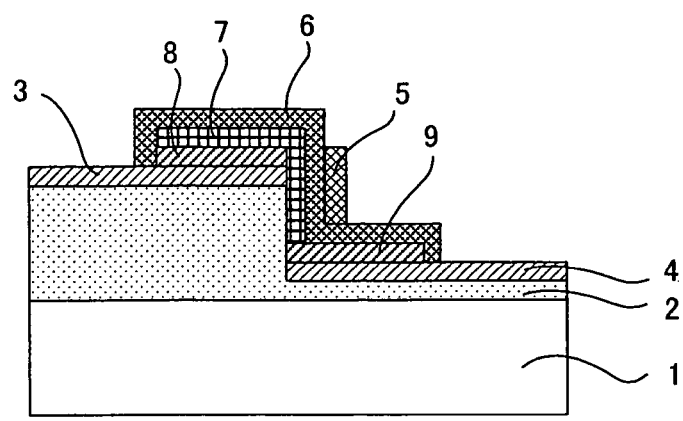
FIG. 3 is a cross-sectional view that shows one example of a thin-film transistor of a third embodiment of the present invention.
Figure 4:
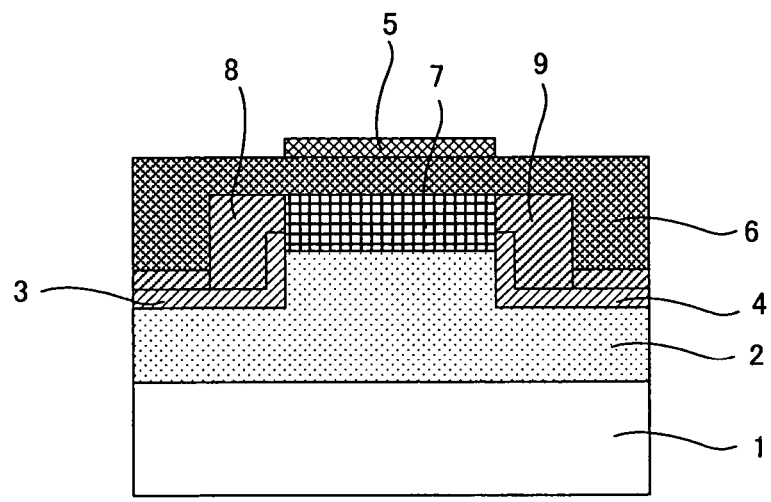
FIG. 4 is a cross-sectional view that shows one example of a thin-film transistor of a fourth embodiment of the present invention.
Figure 5:
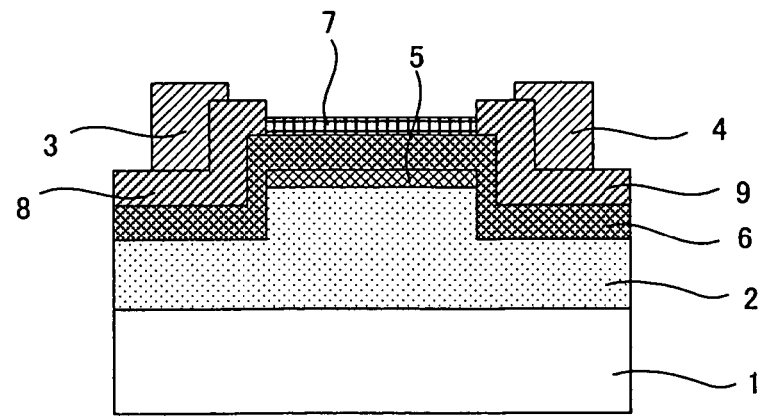
FIG. 5 is a cross-sectional view that shows one example of a thin-film transistor of a fifth embodiment of the present invention.

The thin-film transistor and the method for manufacturing the same of the present invention will be described below referring to the drawings. FIG. 1 is a cross-sectional view that shows one example of a thin-film transistor of the first embodiment of the present invention, FIG. 2 is a cross-sectional view that shows one example of a thin-film transistor of the second embodiment of the present invention, FIG. 3 is a cross-sectional view that shows one example of a thin-film transistor of the third embodiment of the present invention, FIG. 4 is a cross-sectional view that shows one example of a thin-film transistor of the fourth embodiment of the present invention, and FIG. 5 is a cross-sectional view that shows one example of a thin-film transistor of the fifth embodiment of the present invention. Moreover, FIGS. 6 to 10 are explanatory drawings that show each process of the method for manufacturing the thin-film transistor of the present invention.

(Thin-film Transistor)

The thin-film transistor of the present invention is characterized in that it is formed on a substrate with a concavoconvex surface.

As shown in FIGS. 1 and 2, in thin-film transistors of the first and second embodiments, a source (hereinafter, when simply referred to as "source", this indicates a structure including a source electrode 3 and a source side diffusion layer 8) and a drain (hereinafter, when simply referred to as "drain", this indicates a structure including a drain electrode 4 and a drain side diffusion layer 9) are formed on adjacent convex portions of the concavoconvex surface, and a semiconductor channel layer 7 and a gate (hereinafter, when simply referred to as "gate", this indicates a structure including a gate electrode 5 and a gate insulating film 6) are formed on a concave area between the convex portions.

Among these, in the concave area of the thin-film transistor of the first embodiment, as shown in FIG. 1, a gate electrode 5, a gate insulating film 6 and a semiconductor channel layer 7 are laminated, in this order from the bottom toward the top, on the bottom surface of the concave portion. Moreover, on the top surface of one of the adjacent convex portions located on both sides of the concave area, a source electrode 3 and a polycrystal silicon layer which is a source side diffusion layer 8 are laminated in this order, and on the top surface of the other convex portion, a drain electrode 4 and a polycrystal silicon layer 9 which is a drain side diffusion layer 9 are laminated in this order.

Moreover, in the concave area of the thin-film transistor of the second embodiment, as shown in FIG. 2, a semiconductor channel layer 7, a gate insulating film 6 and a gate electrode 5 are laminated, in this order from the bottom toward the top, on the bottom surface of the concave portion. Moreover, on the top surface of one of the adjacent convex portions located on both sides of the convex area, a polycrystal silicon layer which is a source side diffusion layer 8 and a source electrode 3 are laminated in this order via a contact hole 10 formed in the gate insulating film 6, and on the other top surface of the other convex portion, a polycrystal silicon layer which is a drain side diffusion layer 9 and a drain electrode 4 are laminated in this order via the contact hole 10 formed in the gate insulating film 6.

In the thin-film transistor of the third embodiment, as shown in FIG. 3, either one of the source electrode 3 or the drain electrode 4 is formed on the top surface of a convex portion of the concavoconvex surface 2, and a semiconductor channel layer 7 and a gate electrode 5 are formed on a side surface area connecting to the top surface of the convex portion, and the remaining one of the source electrode 3 or the drain electrode 4 is formed on a bottom surface of the concave portion connecting to the side surface of the convex portion. For more detailed explanation referring to an example shown in FIG. 3, on the top surface of the convex portion, the source electrode 3, the polycrystal silicon layer which is the source side diffusion layer 8 and the polycrystal silicon layer which is the semiconductor channel layer 7 are laminated in this order, and on the bottom surface of the concave portion, the drain electrode 4, the polycrystal silicon layer which is the drain side diffusion layer 9 are laminated in this order. The polycrystal silicon layer which is the semiconductor channel layer 7 is provided so as to cover the source side diffusion layer 8 on the top surface of the convex portion from the side surface of the convex portion, and the gate insulating film 6 is provided so as to cover the semiconductor channel layer 7 and the drain side diffusion layer 9 on the bottom surface of the concave portion. Moreover, the gate electrode 5 is provided on the gate insulating film 6 on the side surface of the convex portion.

As shown in FIG. 4, in the thin-film transistor of the fourth embodiment, the semiconductor channel layer 7, the gate insulating film 6 and the gate electrode 5 are laminated in this order on the top surface of the convex portion of the concavoconvex surface 2 in succession, and the source electrode 3/source side diffusion layer 8 and the drain electrode 4/drain side diffusion layer 9 are respectively formed on each bottom surfaces located on both sides of the convex portion.

As shown in FIG. 5, in the thin-film transistor of the fifth embodiment, the gate electrode 5, the gate insulating film 6 and the semiconductor channel layer 7 are laminated in this order on the top surface of the convex portion of the concavoconvex surface 2, and the source side diffusion layer 8/source electrode 3 and the drain side diffusion layer 9/drain electrode 4 are respectively formed on each bottom surfaces located on both sides of the convex portion.

Since the thin-film transistor of the present invention having the above mentioned features is formed on the fine concavoconvex surface with superior dimensional precision, the source, the drain, the gate and the semiconductor channel layer are formed in the fine scale. Consequently, in this thin-film transistor, the channel portion to be formed can be formed uniformly over a large area, making it possible to form a thin-film transistor having uniform performances into a large area. Moreover, it becomes possible to achieve semiconductor channel layers in the sub-micron order (for example, in the order of not more than 100 nm) that have been recently required.

The following description will discuss the respective components:

The substrate 1 constitutes a circuit substrate of the thin-film transistor, and examples of the material thereof include: inorganic materials such as glass, silicon wafers and quartz, or organic materials, such as polyamide, polyacetal, polybutylene terephthalate, polyethylene terephthalate, polyethylene naphthalate, or syndio-tactics-polystyrene; polyphenylene sulfide, polyether ether ketone, liquid crystal polymers, fluororesin, or polyether nitrile; polycarbonate, modified polyphenylene ether, polycyclohexene, or polynorbornane-based resins; or polysulfone, polyether sulfone, polyallylate, polyamideimide, polyether imide or thermoplastic polyimide, or composite materials of these. Moreover, with respect to the organic materials, those formed of usual plastics may also be used. In particular, in the case when the substrate 1 is formed of an organic base material, the thickness thereof is preferably set in a range of 5 μm to 1000 μm, and more preferably, those materials having a thin, flexible film shape with a thickness in a range of 5 μm to 300 μm are used; thus, the substrate on which the thin-film transistor is formed can be flexible.

The concavoconvex surface is formed on the substrate 1 with a curing resin. With respect to the curing resin composition to be used to form the concavoconvex surface, examples thereof include: curing resins, such as unsaturated polyesters, melamine, epoxy, polyester (metha)acrylate, urethane (metha)acrylate, epoxy (metha)acrylate, polyether (metha)acrylate, polyol (metha)acrylate, melamine (metha)acrylate or triazine-based acrylate; and each of these may be used alone, or two or more kinds of these may be used in a mixed state. If necessary, a curing agent, a photopolymerization initiator or the like may be added to the curing resin composition, and can be used as curing resin such as a thermosetting resin composition or an ionizing radiation curing resin composition such as an ultraviolet curing resin composition. The curing resin composition preferably has a viscosity that is suitable for coating, and a solvent or a monomer may be added so as to adjust the viscosity. As will be described later, the above mentioned curing resin composition is cured by heat, ultraviolet rays, ionizing radiation or the like, in a sandwiched state between the substrate 1 and the concavoconvex surface forming substrate, so as to have a desired fine shape.

Figure 11A:
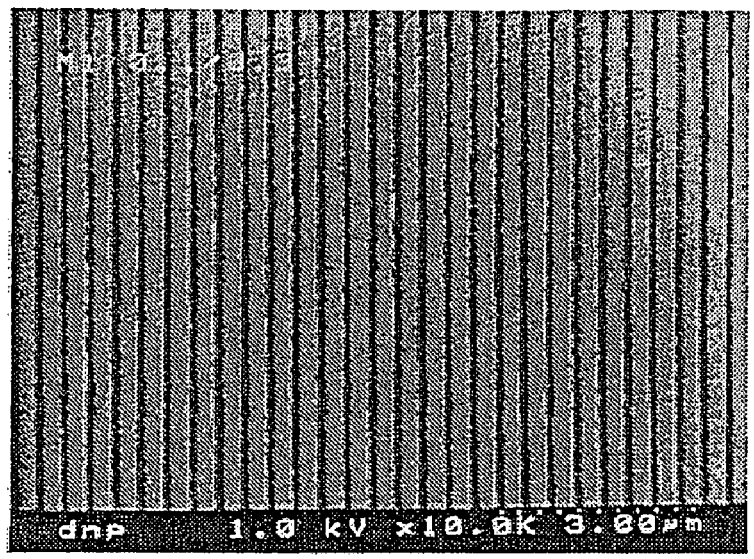
FIGS. 11A and 11B are a photomicrograph of a surface of a concavoconvex surface forming substrate used for forming a concavoconvex surface and a photomicrograph of the concavoconvex surface formed on a substrate that is applied to a thin-film transistor of the present invention.
Figure 11B:
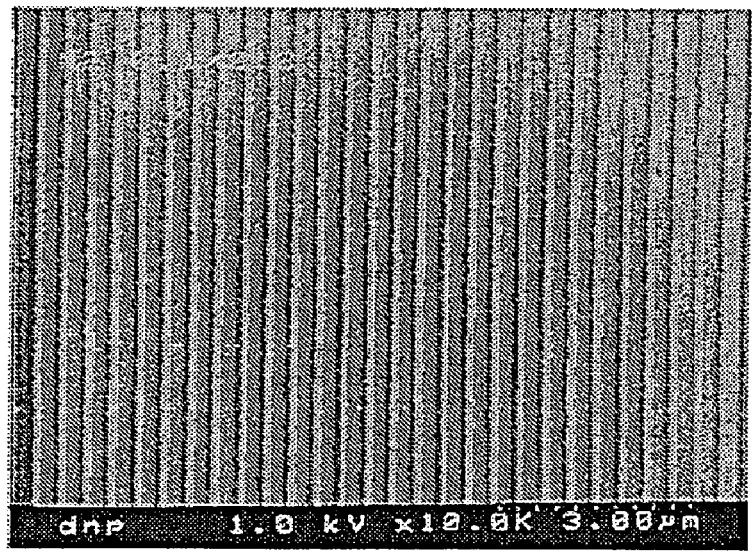

The present invention is characterized in that the concavoconvex surface is formed over a large area with high precision, and formation of a minute structure in the sub-micron order is possible. By utilizing the concavoconvex shape, it becomes possible to provide a thin-film transistor with extreme uniformity, as well as a very fine thin-film transistor. Consequently, as to the scale of the concavoconvex surface, the width of the bottom surface of the concave portion is preferably set in a range of 10 nm to 100,000 nm, the height from the bottom surface of the concave portion to the top surface of the convex portion is preferably set in a range of 50 nm to 10,000 nm, and the width of the top surface of the convex portion is preferably set in a range of 10 nm to 100,000 nm. Because the thin-film transistor of the present invention is formed on the concavoconvex surface that may be varied desirably within these ranges, it is possible to provide extremely fine element. Here, FIG. 11B is a photomicrography that shows a concavoconvex surface provided on a substrate adopted to a thin-film transistor of the present invention, and FIG. 1A is a photomicrography that shows a surface of a concavoconvex surface forming substrate to be used for forming the concavoconvex surface.

The present method makes it possible to form extremely fine structure, and its structure preparation tests show that a structure of 0.1 μm/0.3 μm can be formed (see the photograph). Moreover, it has been found that a structure of 10 nm can also be formed, which indicates the possibility of a patterning exceeding the photolithography.

With respect to the respective elements constituting the thin-film transistor, those materials generally used conventionally may be adopted. For example, with respect to the source electrode 3, drain electrode 4 and gate electrode 5, electrode materials including Al, Cu and the like may be preferably used, and the thickness is set in a range of 10 nm to 1000 nm. Moreover, the polycrystal silicon film constituting the source side diffusion layer 8 and the polycrystal silicon film constituting the drain side diffusion layer 9 are formed of low resistance polycrystal silicon doped with impurities, in the same manner as the conventional material. Moreover, the semiconductor channel layer 7 is formed of generally used polycrystal silicon. Here, the polycrystal silicon films that constitute each diffusion layer can be obtained by crystallizing an amorphous silicon film preliminarily formed, by a laser annealing process and the like, as will be described later in the method for manufacturing.

Here, the semiconductor channel layer 7 may be formed by a semiconductor other than the polycrystal silicon film, those materials that have been widely used as semiconductor materials for use in thin-film transistors or those being examined as semiconductor materials may be adopted, and with respect to the other inorganic compound semiconductor materials, hydrogenated amorphous silicon, hydrogenated amorphous silicon germanium, hydrogenated amorphous silicon carbide, crystallite silicon, polycrystal silicon and the like can be used. Moreover, materials such as CdS, ZnS, or a mixed crystal of CdS and ZnS, CdTe or Se may be used.

With respect to the organic semiconductor materials, preferable examples thereof include: π-electron conjugate type aromatic compounds, chain compounds, organic pigments and organic silicon compounds. Specific examples thereof include: pentacene, tetracene, thiophene oligomer derivatives, phenylene derivatives, phthalocyanine compounds, polyacetylene derivatives, polythiophene derivatives and cyanine pigments, however, materials are not limited to the above.

Moreover, a protecting film, a light shielding layer, a complementary thin-film transistor and the like may be formed further on the thin-film transistor. With respect to the protecting film, a $SiO_2$ film, a SiN film or the like may be formed by a sputtering method or the like.

(Method for Manufacturing Thin-film Transistor)

The above mentioned thin-film transistor having a minute structure can be manufactured by the following method. The example for the method for manufacturing shown here relates to the first embodiment that will be described later, and specific descriptions thereof can be applied to any of the methods for manufacturing relating to the second to fourth embodiments that will be described later.

Figure 6A:
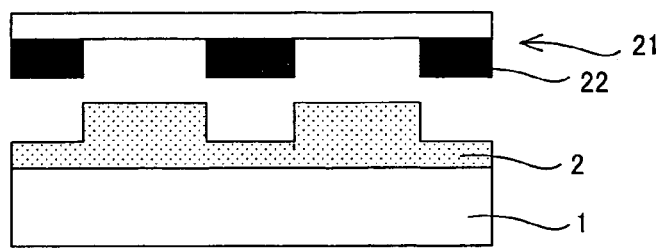
FIGS. 6A to 6L are process drawings that show a first example of a method for manufacturing a thin-film transistor of the present invention.

(1) First, as shown in FIG. 6A, a substrate 1 to be used for forming a thin-film transistor and a concavoconvex surface forming substrate 21, on which a concavoconvex surface forming pattern 22 (hereinafter, referred to as pattern 22) is formed, are prepared. Here, the same substrate 1 as described above is used.

With respect to the elements forming the concavoconvex surface forming substrate 21, the same materials as those forming the substrate 1 may be used. In the case where the concavoconvex surface forming substrate 21 is also used as a mask 25 which will be described later, it is preferably be formed of a material that has transparency for exposing light such as UV rays. The thickness of the concavoconvex surface forming substrate 21 may be desirably set, and from the viewpoint of dimensional stability, a thick one is preferable. When glass or quartz is used as the base material, the thickness is normally set in a range of 1 mm to 5 mm, and in the case of an organic base material, the thickness is normally set in a range of 50 μm to 1000 μm.

The pattern 22, formed on the concavoconvex surface forming substrate, is prepared by forming a material such as a photocuring resin layer, that can be patterned, on the substrate 21 and then patterning the material. With respect to the pattern 22, either a thin film layer of an inorganic substance such as chromium, or a layer of a resin composition containing a dye, a pigment or the like, may be used. When the pattern 22 is constituted by the presence and absence of a layer of an inorganic substance such as chromium, the pattern 22 may be formed by using a photo-etching method in the same manner as the photo-mask method for manufacturing for a semiconductor. Alternatively, the pattern 22 may be formed by a method in which a photosensitive resin layer, formed on a base material by coating or laminating, is subjected to pattern exposing and developing.

The pattern 22 is constituted by concave-shaped portions that form convex portions on the substrate and convex-shaped portions that form concave portions on the substrate, which will be described later. Here, since the concavoconvex surface forming substrate 21 also serves as a stamper that gives the shape of the concavoconvex surface 21 on the substrate 1 forming a thin-film transistor, the thickness of the pattern 22 is formed with high precision, for example, within a range of 50 nm to 10,000 nm. Moreover, the width of the pattern 22 and the width dimension of the pattern intervals are formed with high precision within a range of 10 nm to 100,000 nm. The cross sectional shape of the pattern 22 is preferably formed into a shape close to a square as possible, and in a case where corners of the cross sectional shape is rounded, the curvature radius "r" thereof is preferably not more than 1/10 of the thickness of a light-shielding layer.

In the method for manufacturing of the present invention, a substrate having the same pattern shape as the concavoconvex surface forming substrate 21 may be used later as an exposing mask 25. When the same one is used as the concavoconvex surface forming substrate 21 and the exposing mask 25, the pattern is preferably formed to have light shielding property. With respect to the method for forming the light shielding pattern, the same methods as those conventionally used may be adopted, and for example, the pattern 22 may be formed of a chromium thin film or the like, or the pattern 22 may be formed of a composition containing a light shielding dye or a pigment.

(2) Next, as shown in FIG. 6A, after sandwiching a curing resin composition by the two substrates 1 and 21, the curing resin composition is cured, and then, the concavoconvex surface forming substrate 21 is demolded so that a substrate with a concavoconvex surface 2, formed of the curing resin, is formed.

In other words, the substrate 1 and the concavoconvex surface forming substrate 21 are superimposed so that the pattern 22 is on the substrate 1 side and with the curing resin composition being sandwiched in between. The material to be sandwiched in between the two substrates is not necessarily limited to the curing resin composition, however, considering the heat applied upon forming various thin-films in the succeeding processes and the application of the thin-film transistor, it is preferable to use a curing resin composition with properties such as high heat resistance and high durability.

At this time, the resin composition may be sandwiched in between the substrate 1 and the concavoconvex surface forming substrate 21 by: coating either one or the both of the surface of the substrate 1 and the pattern surface of the concavoconvex surface forming substrate 21 with a curing resin composition, and then superimposing the above two substrates; or fixing the two substrates with a clearance in between each other, and injecting the curing resin composition in between.

The curing of the curing resin composition is carried out by letting the composition stand for a predetermined period of time at normal temperature or in a heated state. Moreover, in the case where an ionizing radiation curing resin composition such as an ultraviolet curing resin composition is used, the curing can be carried out by irradiating the curing resin composition with ionizing radiation such as UV rays (Ultraviolet rays). Here, when curing by irradiating ionizing radiation, the irradiation is preferably carried out from the side of the one having an ionizing radiation transmitting property among the substrate 1 and the concavoconvex surface forming substrate 21.

Thereafter, by demolding the concavoconvex surface forming substrate 21, a concavoconvex surface 2 having a minute concavoconvex pattern formed of the curing resin is formed on the substrate 1. The thickness, the height, the width and the like of the concavoconvex surface are determined as described above.

Figure 6B:
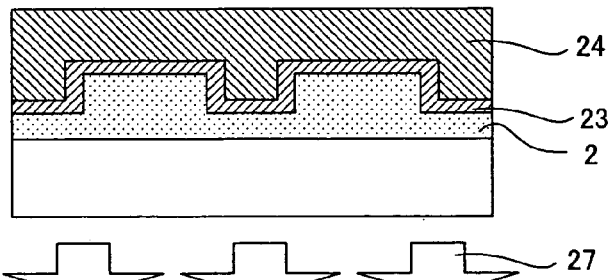

(3) Next, as shown in FIG. 6B, after forming a conductive thin film 23 over the entire surface of the concavoconvex surface 2, a resist film 24 is further formed thereon so that the concavoconvex surface 2 is flattened. The conductive thin film 23 is eventually formed into source electrodes 33, drain electrodes 34 and gate electrodes 35, and for this reason, Al, Cu and other electrode materials are preferably used as the thin film material, and is formed into a film by a known thin-film forming method such as sputtering. The thickness of the conductive thin film 23 is normally in a range of 10 nm to 1000 nm.

For example, a positive type photoresist and the like are preferably used as the resist film 24. The resist film is formed with the positive type photoresist because the resist on the convex portions can be dissolved and removed with a mask that will be described later. The resist film 24 is preferably formed by coating resist over the entire surface using a spinner or the like and cured so that the concavoconvex surface 2 is flattened. The reason that the resist film 24 is formed so that the concavoconvex surface 2 is flattened is because a mask, which will be described later, can be closely contacted to the resist film 24; thus, it becomes possible to prevent light scattering caused by the concavoconvex, and to improve the uniformity of the pattern.

Figure 6C:
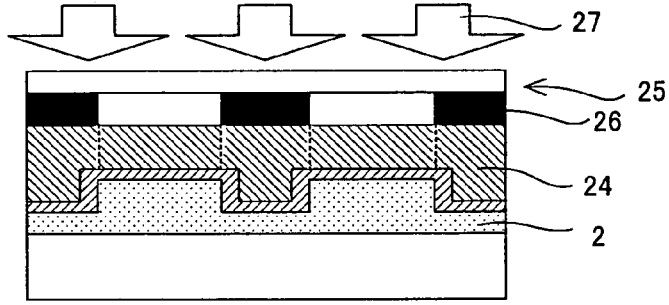
Figure 6D:
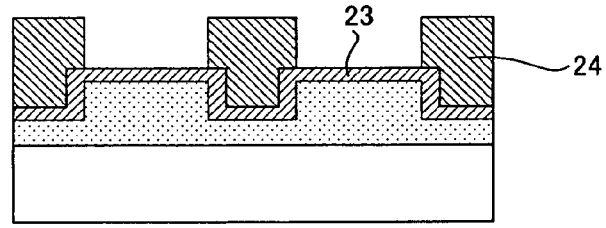

(4) Next, as shown in FIGS. 6C and 6D, a mask 25 with the same concavoconvex pattern 26 as the concavoconvex surface forming substrate 21, is used to expose and develop the resist film 24 so that the conductive thin film 23 on the top surface of the convex portion is bared.

A mask prepared by forming a light shielding pattern, formed of a light shielding material such as chromium, on a glass substrate may be used as the mask 25. With respect to the method for forming the light shielding pattern, the same processes as those conventionally used may be adopted. For example, the pattern 22 may be formed with a chromium thin film or the like, or the pattern 22 may be formed with a composition containing a light shielding dye or pigment. Here, the mask 25 is preferably used also as the above mentioned concavoconvex surface forming substrate 21.

Figure 6E:
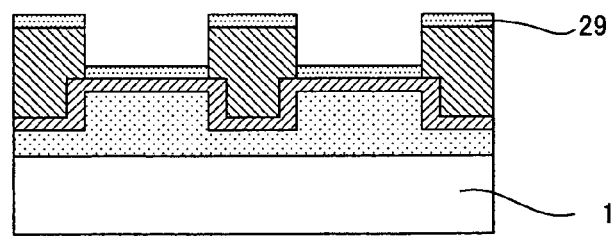

(5) Next, as shown in FIG. 6E, an impurity containing amorphous silicon thin film 29 is formed over the entire surface which is bared. The impurity is contained because, in the later performed laser annealing process, a low resistance polycrystal silicon thin film can be formed, also in order to get ohmic contact to the metal electrodes. The doping of impurities into the amorphous silicon is carried out by sputtering or the like using a silicon target doped with the impurities. With respect to the method for forming the thin film 29, a vapor deposition method, a CVD method and the like can be listed in addition to the sputtering method. The thickness of the impurity containing amorphous silicon thin film is normally in a range of 5 nm to 50 nm.

Figure 6F:
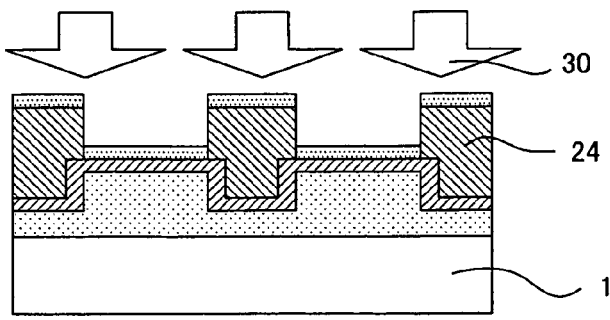
Figure 6G:
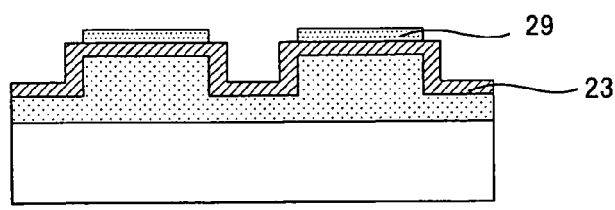

(6) As shown in FIGS. 6F and 6G, exposing and developing processes are carried out from the front surface of the substrate 1 so that the resist film 24 and the impurity containing amorphous silicon thin film 29 remaining in the concave area are removed. By irradiating exposing light from the front surface of the substrate, the positive type photoresist formed in the concave area is made to be dissolvable. The dissolvable resist film is dissolved in a developing solution so that the resist film 24 and the impurity containing amorphous silicon thin film 29 on the concave area are removed.

Figure 6H:
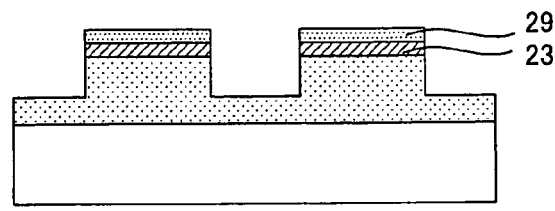

(7) Next, as shown in FIG. 6H, the conductive thin film 23 on the bared portion is etched. With respect to the etching solution, a generally used etching solution, such as a mixed solution of nitric acid and phosphoric acid and the like may be used. The impurity containing amorphous silicon thin film 29 acts as a resist film, and the substrate after etching is provided with a conductive thin film 23 and an impurity containing amorphous silicon thin film 29 on the top surface of the convex portion.

Figure 6I:
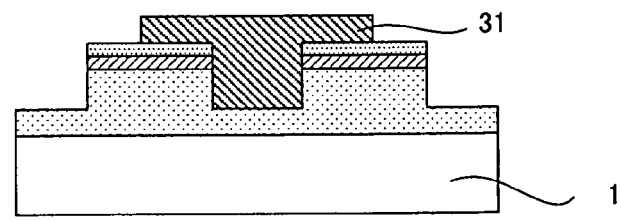

(8) Next, as shown in FIG. 6I, an amorphous silicon thin film 31 is formed over the entire surface of the substrate that has been subjected to the etching process. The amorphous silicon thin film 31 is formed by a sputtering method using a silicon target containing no impurities, a vapor deposition method, a CVD method or the like. The thickness of the amorphous silicon thin film 31 is normally set in a range of 30 nm to 300 nm.

Figure 6J:
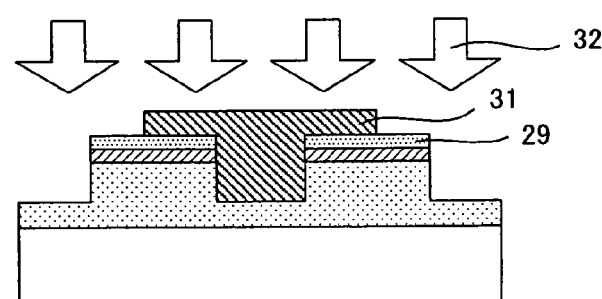
Figure 6K:
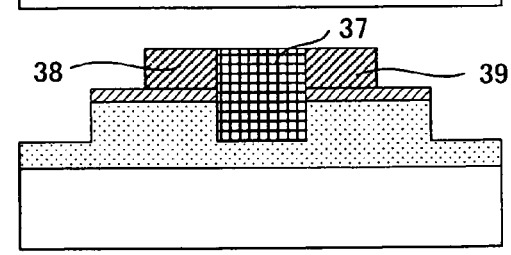

(9) As shown in FIGS. 6J and 6K, at the same time of forming a semiconductor channel layer 37 formed of polysilicon by a laser annealing process, a source side diffusion layer 38 and a drain side diffusion layer 39, formed of low resistance polysilicon, are formed by crystallizing the impurity containing amorphous silicon thin film on the top surface of the convex portion. The laser annealing process is a crystallizing method in which the amorphous silicon thin film is crystallized to form polysilicon (polycrystal silicon), and may be carried out by using various laser devices such as a XeCl excimer laser and a CW (Continuous Wave) laser. Here, after the crystallization, in order to eliminate defects of silicones on the polycrystal gain boundaries, a hydrogen plasma treatment and a $H_2O$ vapor treatment are also effectively used. Moreover, in the case where no impurity containing amorphous silicon thin film is formed, an ion doping may be carried out before or after the laser annealing process to form the source side diffusion layer 38 and the drain side diffusion layer 39.

(10) Next, as shown in FIG. 6(I), a gate insulating film 36 is formed on the semiconductor channel layer 37, the source side diffusion layer 38 and the drain side diffusion layer 39. With respect to the gate insulating film 36, a $SiO_2$ thin film is preferably used, and, for example, a film forming method such as reactive sputtering may be used. Moreover, other film forming methods (CVD method by TEOS, organic thin film, and the like) may be used.

(11) Next, a gate electrode 35 is formed on the gate insulating film 36 on the upper portion of the semiconductor channel layer. The gate electrode 35 can be formed by a film forming process such as sputtering by using the same conductive material, such as Al, Cu and the like, as the above mentioned source electrode 3 and the drain electrode 4.

According to the first method for manufacturing as mentioned above, unlike the conventional TFT manufacturing method using the general photolithography technique, a concavoconvex surface formed of a curing resin is formed on the substrate by using a concavoconvex surface forming substrate, and the concave portion of the concavoconvex surface is used as a semiconductor channel layer of the TFT; thus, by improving the degree of precision of the concavoconvex surface using the above mentioned concavoconvex surface forming substrate, the semiconductor channel layer can be uniformed and miniaturized. Consequently, it becomes possible to easily manufacture a thin-film transistor having a semiconductor channel layer in the order of not more than 100 nm, and also to provide a method for manufacturing that achieves a thin-film transistor with a larger area, and suitable for mass production.

(First Embodiment)

After formed a Cr thin film layer having a thickness of 500 nm on a quartz substrate, a predetermined pattern 22 was formed by a photo-etching method so that a concavoconvex surface forming substrate 21 was manufactured (FIG. 6A). At this time, the pattern 22 had an arrangement in which concave portions, each having a depth of 500 nm with a width of 10 μm, were aligned face to face with a gap between two concave portions of 10 μm.

Between the pattern 22 of this concavoconvex surface forming substrate 21 and a substrate 1 formed of non-alkali glass (1737, manufactured by Corning, Inc) having a thickness of 0.7 mm, an uncured transparent UV curing resin composition was sandwiched and laminated, and this was exposed to UV-rays from the substrate 1 side so that the UV curing resin composition was cured. Thereafter, a concavoconvex surface 2 having convex portions having a line width of 10 μm and a height of 500 nm, with a gap between two convex portions of 10 μm, was formed on the substrate 1 by demolding the concavoconvex surface forming substrate 21 (FIG. 6A).

After forming an Al thin film 23 having a thickness of 500 nm over the entire surface of the resulting concavoconvex surface 2 by sputtering method, a positive type photoresist (trade name: PMER P-LA900, manufactured by Tokyo Ohka Kogyo Co., Ltd.) was coated thereto by a spinner, and after coating, this was heated at 80° C. for 30 minutes to form a positive type photoresist film 24 having a thickness of 8 μm. At this time, the surface of the resist film 24 was flattened (FIG. 6B).

The previously used concavoconvex surface forming substrate 21 was aligned on the positive type photoresist film 24 at the same position as the concavoconvex surface 2 was formed, and made closely contacted therewith so that the side of the pattern 22 was made in contact with the positive type photoresist film 24, and this was exposed to ultraviolet rays 27 from the concavoconvex surface forming substrate 21 side (FIG. 6C). After the exposing, this was developed using a developing solution (trade name: PMER Dev P-7G, manufactured by Tokyo Ohka Kogyo Co., Ltd.) so that the dissolvable portion of the positive type photoresist film 24 on the convex portions corresponding to exposed portions was removed, thereby baring the Al thin film 23 on the convex portions (FIG. 6D).

Over the entire surface of the substrate 1 on which this pattern was formed, an impurity containing amorphous silicon thin film 29 was further formed with a thickness of 30 nm by sputtering method using a silicon target doped with P-type impurities (FIG. 6E). Thereafter, this was exposed to ultraviolet rays 30 from the front surface of the substrate 1 (FIG. 6F) so that residual positive type photoresist film 24 within the concave portion was made dissolvable, and removed by using a developing solution (trade name: PMER Dev P-7G, manufactured by Tokyo Ohka Kogyo Co., Ltd.) (FIG. 6G).

Thereafter, the bared Al thin film 23 was subjected to an etching by using a mixed acid (mixture of nitric acid and phosphoric acid). At this time, since the impurity containing amorphous silicon film 29 acts as a resist film, the Al thin film 23 on the convex portions remained as a source electrode 33 and a drain electrode 34, with only the Al thin film 23 on the concave portion being removed (FIG. 6H).

Next, a sputtering was carried out over the entire surface of the patterned substrate 1 by using a silicon target containing no impurities so that an amorphous silicon thin film 31 containing no impurities was formed with a thickness of 50 nm (FIG. 6I).

Thereafter, a laser annealing process was carried out by using a XeCl excimer laser 32 having a predetermined power (FIG. 6J) to crystallize the amorphous silicon so form a polysilicon thin film to be a semiconductor channel layer 37 (FIG. 6K). Here, with respect to the impurity containing amorphous silicon thin film 29 and the amorphous silicon thin film 31 containing no impurities on the Al electrodes, upon crystallization, the impurities in the impurity containing amorphous silicon thin film 29 are diffused in the amorphous silicon thin film 31 containing no impurities, and these two films are further crystallized. For this reason, these laminated silicon thin film portions were formed as the low resistance source side diffusion layer 38 and the drain side diffusion layer 39. Moreover, the impurities were activated simultaneously due to heat upon crystallization.

Figure 6L:
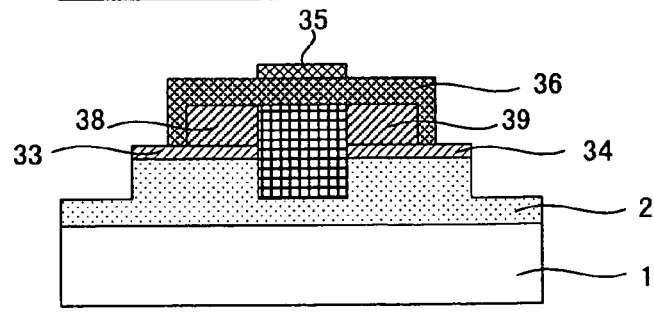

Thereafter, a SiO$_2$ thin film was formed on a polysilicon thin film with a thickness of 100 nm by reactive sputtering method so that a gate insulating film 36 was formed. Further, an Al film having a thickness of 500 nm was patterned on the semiconductor channel layer 37 to form a gate electrode 35 so that a thin-film transistor (TFT) of the present invention was manufactured (FIG. 6L).

(Second Embodiment)

Figure 7A:
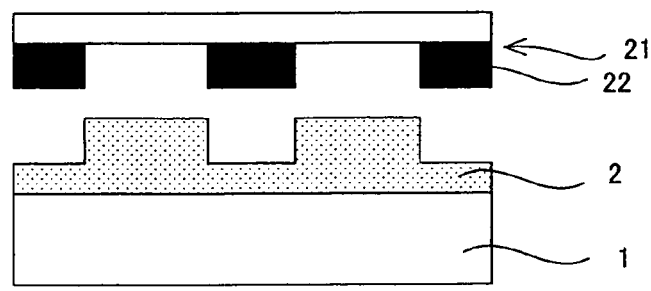
FIGS. 7A to 7K are process drawings that show a second example of a method for manufacturing the thin-film transistor of the present invention.

After forming a Cr thin film layer having a thickness of 500 nm on a quartz substrate, a pattern of source electrodes and drain electrodes having a channel length of 50 μm with a channel width of 50 μm was formed thereon by a photo-etching method so that a concavoconvex surface forming substrate 21 was manufactured (FIG. 7A).

Between the pattern 22 of this concavoconvex surface forming substrate 21 and a substrate 1 formed of non-alkali glass (1737, manufactured by Corning, Inc) having a thickness of 0.7 mm, an uncured transparent UV curing resin composition was sandwiched and laminated, and this was exposed to UV-rays from the substrate 1 side so that the UV curing resin composition was cured. Thereafter, the concavoconvex surface forming substrate 21 was demolded so that a concavoconvex surface 2 having convex structure having a line width of 50 μm and a height of 500 nm, with a gap of two lines of 50 μm, was formed on the substrate 1 (FIG. 7A).

Figure 7B:
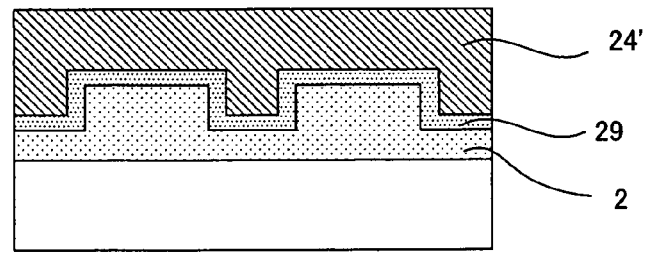

An impurity containing amorphous silicon thin film 29 was formed on the resulting concavoconvex surface 2 with a thickness of 30 nm by sputtering method using a silicon target doped with impurities. Next, a negative type photoresist (trade name: THMR-iP, manufactured by Tokyo Ohka Kogyo Co., Ltd.) was coated thereto by using a spinner to form a negative type photoresist film 24' having a thickness of 2 μm with a flattened upper surface (FIG. 7B).

Figure 7C:
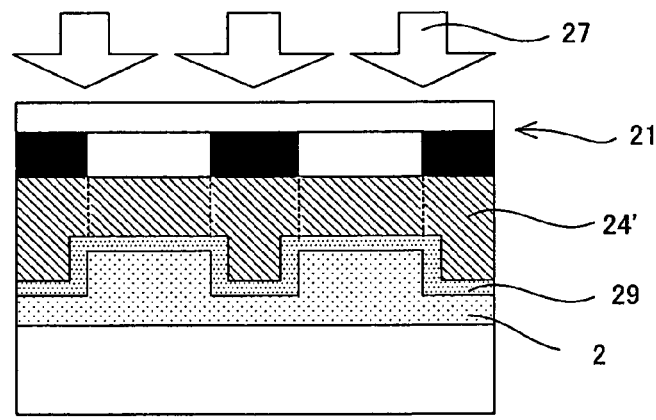
Figure 7D:
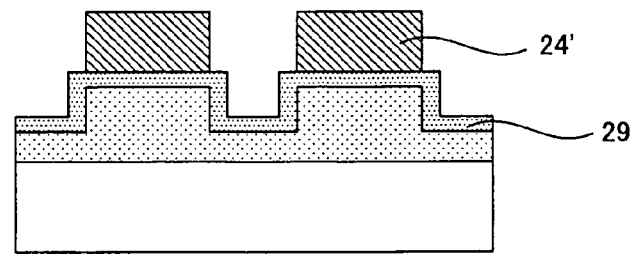

The previously used concavoconvex surface forming substrate 21 was aligned on the negative type photoresist film 24' at the same position of the glass substrate as the concavoconvex surface 2 was formed, and made closely contacted therewith so that the side of the pattern is made contacted with the negative type photoresist film 24', and this was exposed to ultraviolet rays 27 from the concavoconvex surface forming substrate 21 side (FIG. 7C). After the exposing, this was developed by using a developing solution so that the negative type photoresist film 24' was removed except for the film 24' located on the convex portions corresponding to the exposed portions; thus, the impurity containing amorphous silicon thin film 29 was bared on the concave portion (FIG. 7D).

Figure 7E:
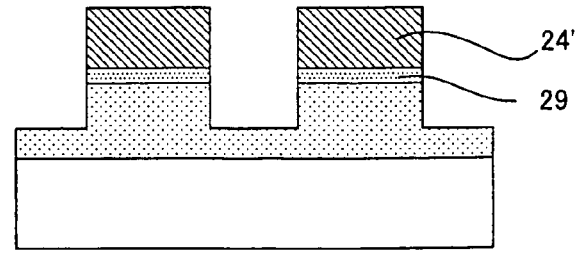
Figure 7F:
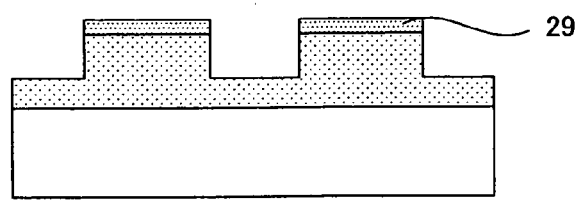

Thereafter, the bared impurity containing amorphous silicon film 29 within the concave portion was etched by using a dry etching device so that the impurity containing amorphous silicon film 29 within the concave portion was removed (FIG. 7E). Then, the resist film 24' was separated so that the impurity containing amorphous silicon film 29 was formed only on the convex portions (FIG. 7F).

Figure 7G:
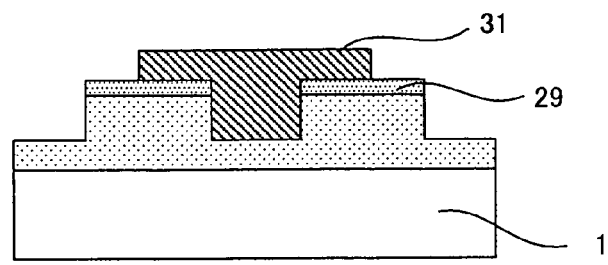
Figure 7H:
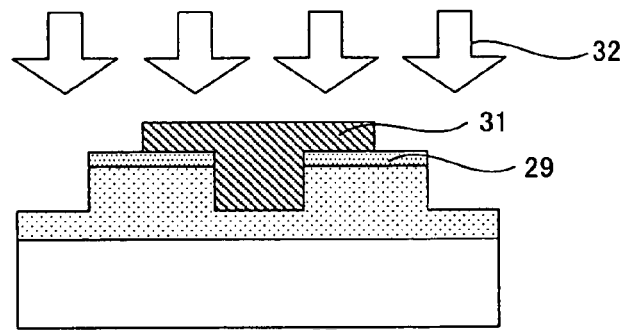
Figure 7I:
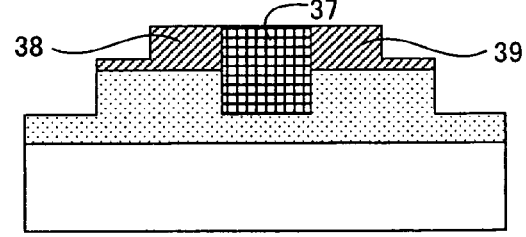

Over the entire surface of the patterned substrate 1, an amorphous silicon thin film 31 containing no impurities was formed with a thickness of 50 nm by sputtering method using a silicon target containing no impurities (FIG. 7G). Thereafter, a laser annealing process was carried out by using a XeCl excimer laser 32 having a predetermined power (FIG. 7H) to crystallize the amorphous silicon so that a polysilicon thin film 37 was formed (FIG. 7I). Here, upon crystallization, the impurities in the impurity containing amorphous silicon thin film 29 were diffused in the amorphous silicon thin film 31 containing no impurities that was laminated on the impurity containing amorphous silicon thin film 29, and further crystallized to form low resistance source side diffusion layer 38 and drain side diffusion layer 39. Moreover, the impurities were activated simultaneously due to heat upon crystallization.

Figure 7J:
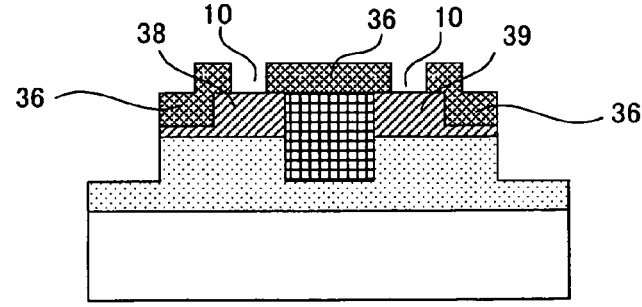

Then, a SiO$_2$ thin film was formed on a polysilicon thin film with a thickness of 100 nm by using a reactive sputtering method so that a gate insulating film 36 was formed. Further, contact holes 10 were formed in the gate insulating film 36 on the source side diffusion layer 38 and the drain side diffusion layer 39 by using a dry etching process and the like (FIG. 7J).

Figure 7K:
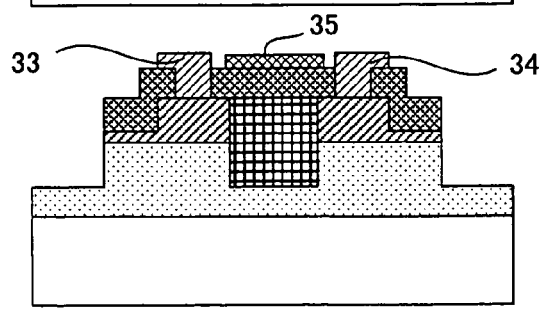

Thereafter, an aluminum (Al) film of 500 nm was vapor-deposited on the entire surface, and patterned so that a source electrode 33, a drain electrode 34 and a gate electrode 35 were formed; thus, a thin-film transistor (TFT) was manufactured (FIG. 7K).

(Third Embodiment)

Figure 8A:
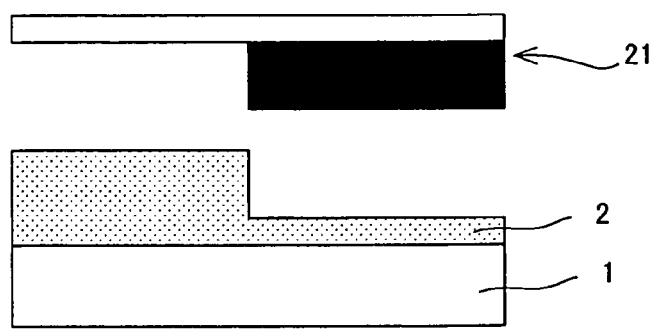
FIGS. 8A to 8J are process drawings that show a third example of a method for manufacturing the thin-film transistor of the present invention.

A concave-shaped pattern having steps with a height of 1.5 μm was formed on a silicon wafer substrate by dry etching method; thus, this was prepared as a concavoconvex surface forming substrate 21 (FIG. 8A).

Between the pattern side of this concavoconvex surface forming substrate 21 and a substrate 1 formed of non-alkali glass (1737, manufactured by Corning, Inc) having a thickness of 0.7 mm, an uncured transparent UV curing resin composition was sandwiched and laminated, and this was exposed to UV-rays from the substrate 1 side so that the UV curing resin composition was cured. Thereafter, the concavoconvex surface forming substrate 21 was demolded so that a concavoconvex surface 2 having a convex-shaped structure having a height of 1.5 μm was formed on the substrate 1 (FIG. 8A).

After forming an Al thin film 23 having a thickness of 100 nm over the entire surface of the resulting concavoconvex surface 2 by using a sputtering method, an impurity containing amorphous silicon thin film 29 was formed over the entire surface of the Al thin film 23 with a thickness of 30 nm by sputtering method using a silicon target doped with impurities.

Figure 8B:
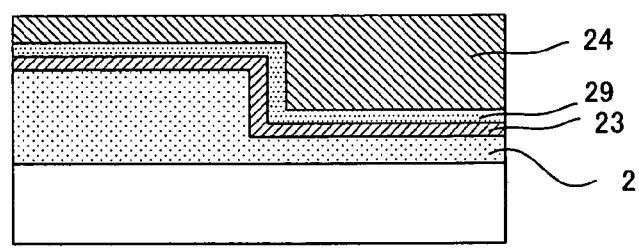

Next, a positive type photoresist (trade name: "OFPR800", manufactured by Tokyo Ohka Kogyo Co., Ltd.) was coated thereto by using a spinner so that a positive type photoresist film 24 having a thickness of 2 μm with a flattened upper surface was formed (FIG. 8B).

Figure 8C:
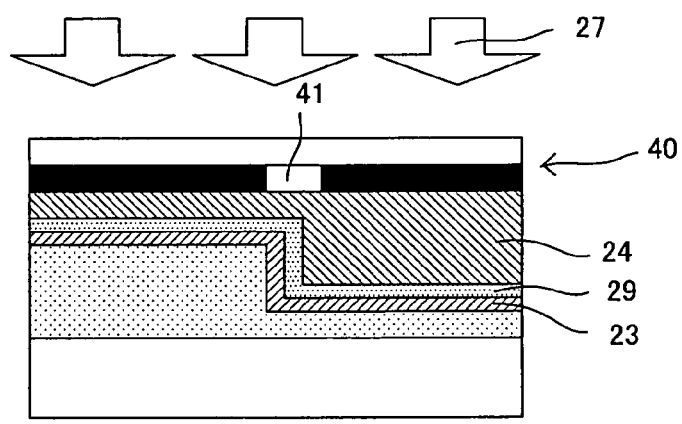
Figure 8D:
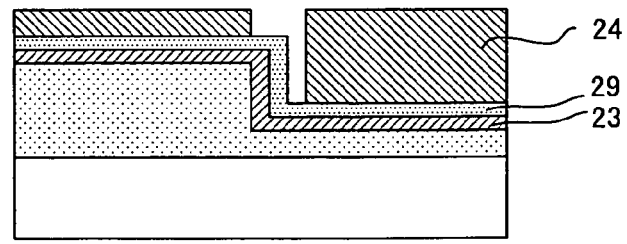

On this positive type photoresist film 24, a photomask 40 having an opening portion 41, with a size similar to the film thickness of the Al thin film 23 and the impurity containing amorphous silicon film 29 formed on the step portion, was aligned to the step portion, and made closely contacted therewith, and this was exposed to ultraviolet rays 27 from the photomask 40 side (FIG. 8C). After the exposing, this was developed by using a developing solution so that the positive type photoresist film 24 on the step portion corresponding to the exposed portion was removed; thus, the impurity containing amorphous silicon film 29 on the step portion was bared (FIG. 8D).

Figure 8E:
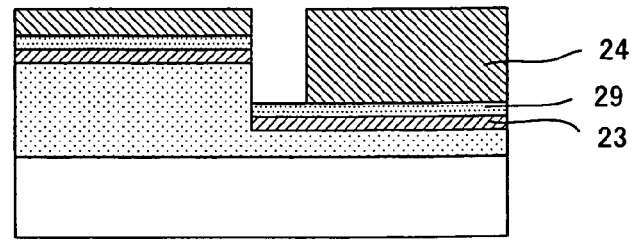
Figure 8F:
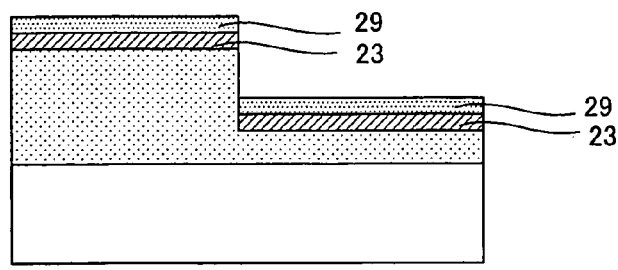

Thereafter, an etching process of the impurity containing amorphous silicon film 29 and the Al thin film 23 on the step portion was carried out by combination of a dry etching device and a wet etching device so that the impurity containing amorphous silicon film 29 and the Al thin film 23 on the step portion were removed (FIG. 8E). Thereafter, by separating the resist film 24, the impurity containing amorphous silicon film 29 and the Al thin film 23 on the concave portion and the convex portion were separated (FIG. 8F).

Figure 8G:
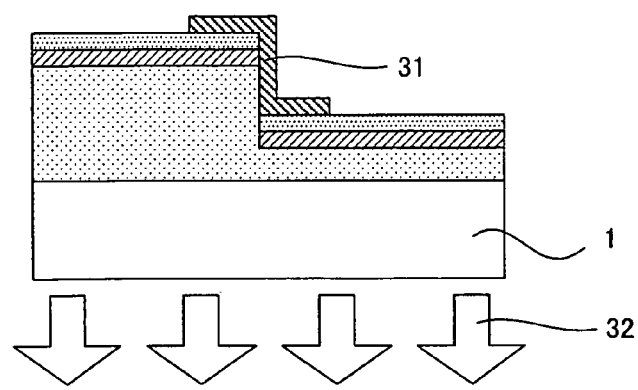
Figure 8H:
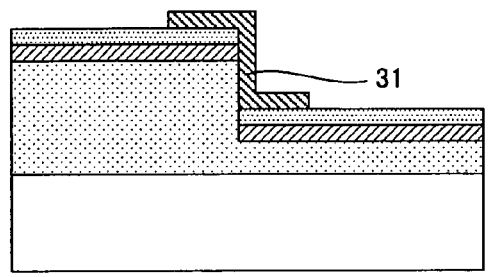
Figure 8I:
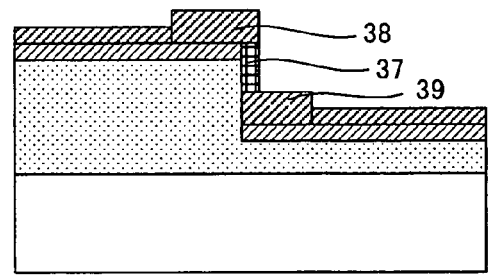

Over the entire surface of the patterned substrate 1, an amorphous silicon thin film 31 containing no impurities was formed with a thickness of 50 nm by sputtering method using a silicon target containing no impurities (FIG. 8G). Thereafter, a laser annealing process was carried out by using a XeCl excimer laser 32 having a predetermined power (FIG. 8H) to crystallize the amorphous silicon thin film 31 so that a polysilicon thin film 37 was formed (FIG. 8I). Here, upon crystallization, the impurities in the impurity containing amorphous silicon thin film 29 were diffused in the amorphous silicon thin film 31 containing no impurities that was laminated on the impurity containing amorphous silicon thin film 29, and further crystallized to form low resistance source side diffusion layer 38 and drain side diffusion layer 39. Moreover, the impurities were activated simultaneously due to heat upon crystallization.

Figure 8J:
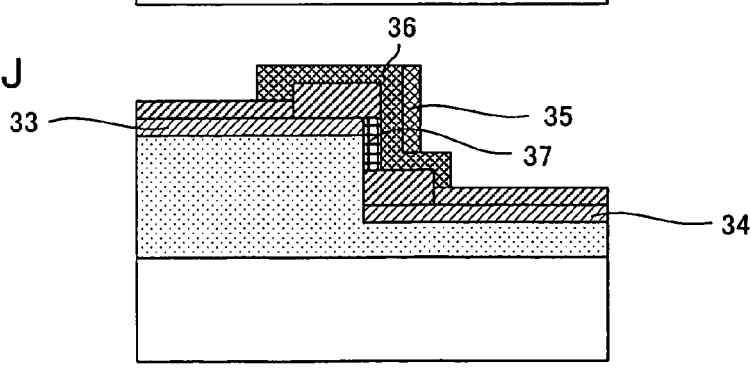

Thereafter, a SiO$_2$ thin film was formed on a polysilicon thin film with a thickness of 100 nm by using a reactive sputtering method so that a gate insulating film 36 was formed. Further, an aluminum (Al) film having a thickness of 500 nm was deposited on the step portion and patterned to form a gate electrode 35 so that a thin-film transistor (TFT) of the present invention was manufactured (FIG. 8J).

(Fourth Embodiment)

Figure 9A:
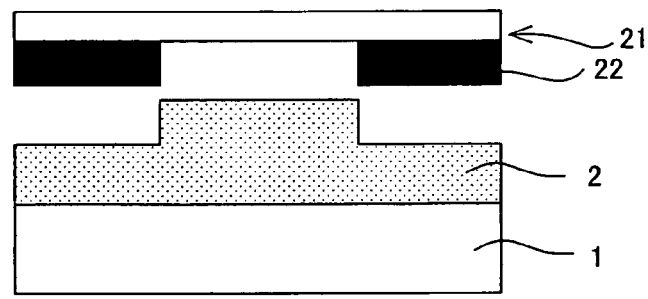
FIGS. 9A to 9J are process drawings that show a fourth example of a method for manufacturing the thin-film transistor of the present invention.

After forming a Cr thin film layer having a thickness of 500 nm on a quartz substrate, a concavoconvex surface forming substrate 21 having a concave portion corresponding to a channel length of 10 μm, and a channel width of 50 μm was prepared by using a photo-etching method (FIG. 9A).

Between the pattern 22 side of this concavoconvex surface forming substrate 21 and a substrate 1 formed of non-alkali glass (1737, manufactured by Corning, Inc) having a thickness of 0.7 mm, an uncured transparent ultraviolet-ray curing resin composition was sandwiched and laminated, and this was exposed to ultraviolet rays from the substrate 1 side so that the ultraviolet-ray curing resin composition was cured. Thereafter, the concavoconvex surface forming substrate 21 was demolded so that a concavoconvex surface 2 having a convex-shaped structure with a line width of 10 μm, a length of 50 μm and a height of 500 nm was formed on the substrate 1 (FIG. 9A).

Figure 9B:
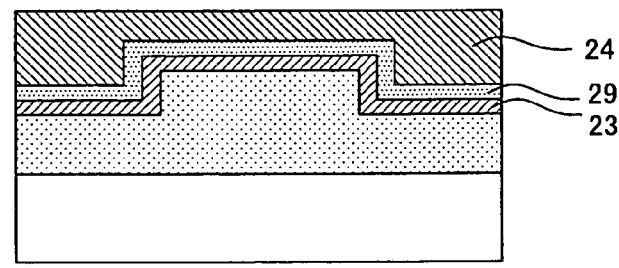

An Al thin film 23 having a thickness of 100 nm was formed over the entire surface of the resulting concavoconvex surface 2 by using a sputtering method. Then, an impurity containing amorphous silicon thin film 29 having a thickness of 30 nm was formed over the entire surface of the Al surface by sputtering method using a silicon target doped with impurities. Thereafter, a positive type photoresist (trade name: PMER P-LA900, manufactured by Tokyo Ohka Kogyo Co., Ltd.) was coated thereto by using a spinner, and after the coating, this was heated at 80° C. for 30 minutes to form a positive type photoresist film 24 having a thickness of 8 μm with a flattened upper surface (FIG. 9B).

Figure 9C:
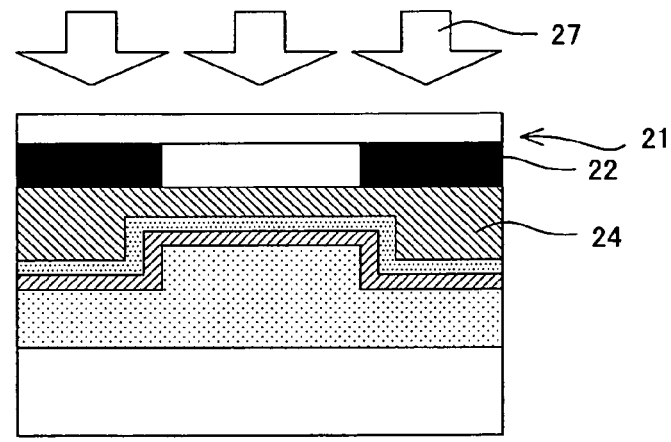

The previously used concavoconvex surface forming substrate 21 was aligned on the positive type photoresist film 24 at the same position as the glass substrate at the time of forming the concavoconvex pattern, and made closely contacted therewith so that the side of the pattern 22 was made in contact with the positive type photoresist film 24, and this was exposed to ultraviolet rays 27 from the concavoconvex surface forming substrate 21 side (FIG. 9C).

Figure 9D:
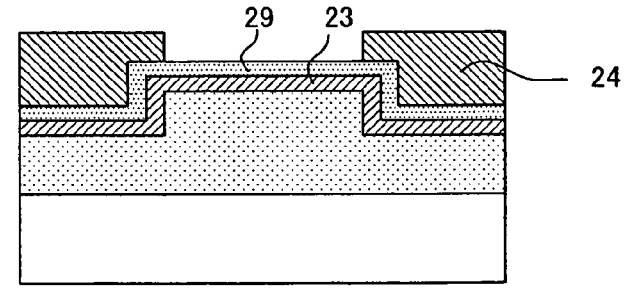

After the exposing, this was developed by using a developing solution (trade name: PMER Dev P-7G, manufactured by Tokyo Ohka Kogyo Co., Ltd.) so that the dissolvable portion of the positive type photoresist film 24 on the convex portions corresponding to exposed portions was removed, thereby baring the impurity containing amorphous silicon film 29 to the convex portions (FIG. 9D).

Figure 9E:
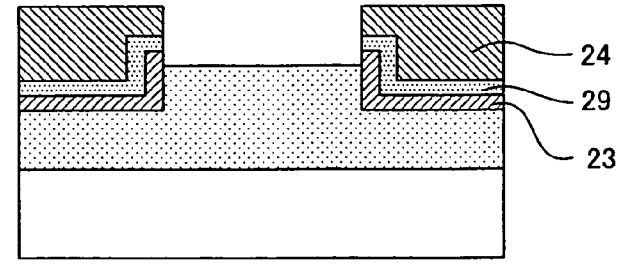
Figure 9F:
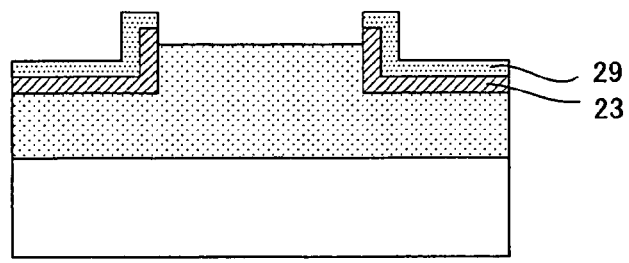

Thereafter, an etching of the impurity containing amorphous silicon film 29 and the Al thin film 23 under the impurity containing amorphous silicon film 29 was carried out by using a combination of a dry etching device and a wet etching device so that the impurity containing amorphous silicon film 29 and the Al thin film 23 on the convex portions were removed (FIG. 9E). Thereafter, the resist film 24 was separated (FIG. 9F).

Figure 9G:
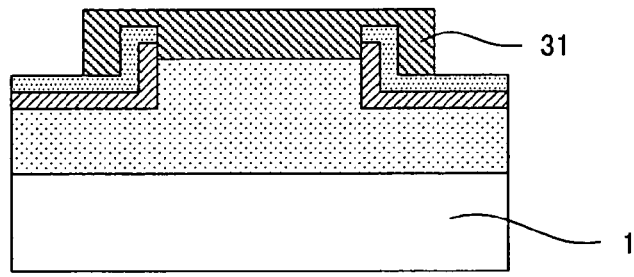
Figure 9H:
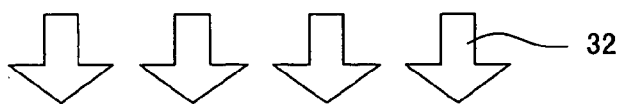
Figure 9H:
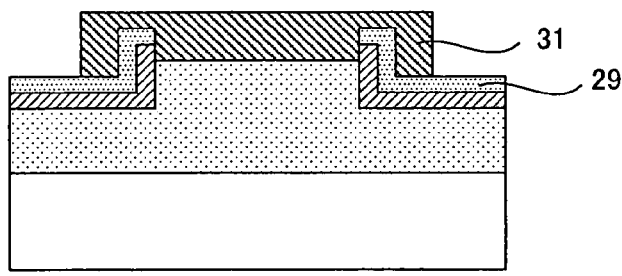
Figure 9I:
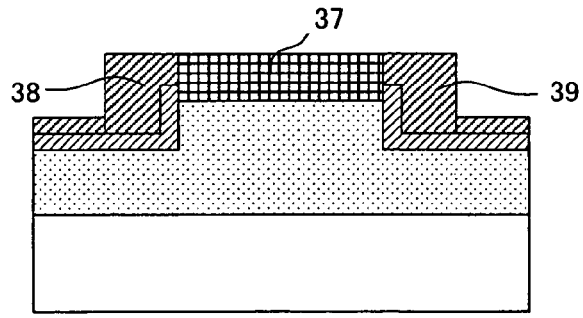

Over the entire surface of the patterned substrate 1, an amorphous silicon thin film 31 containing no impurities was formed with a thickness of 50 nm by sputtering method using a silicon target containing no impurities (FIG. 9G). Thereafter, a laser annealing process was carried out by using a XeCl excimer laser 32 having a predetermined power (FIG. 9H) to crystallize the amorphous silicon so that a polysilicon thin film 37 was formed (FIG. 9I). Here, upon crystallization, the impurities in the impurity containing amorphous silicon thin film 29 were diffused in the amorphous silicon thin film 31 containing no impurities that was laminated on the impurity containing amorphous silicon thin film 29, and further crystallized to form low resistance source side diffusion layer 38 and drain side diffusion layer 39. Moreover, the impurities were activated simultaneously due to heat upon crystallization.

Figure 9J:
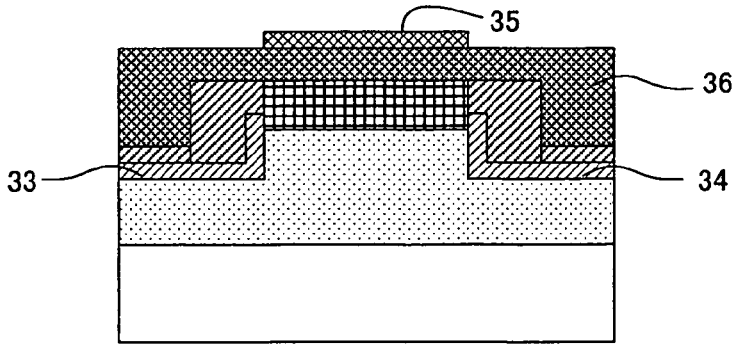

Thereafter, a SiO$_2$ thin film was formed on a polysilicon thin film with a thickness of 100 nm by using a reactive sputtering method so that a gate insulating film 36 was formed. Further, an aluminum (Al) film having a thickness of 500 nm was deposited on the entire surface and patterned to form a gate electrode 35 so that a thin-film transistor (TFT) was manufactured (FIG. 9J).

(Fifth Embodiment)

After forming a Cr thin film layer having a thickness of 500 nm on a quartz substrate, a concavoconvex surface forming substrate 21, having a concave portion corresponding to a channel length of 10 μm, and a channel width of 50 μm, was prepared by using a photo-etching method (FIG. 10A).

Between the pattern 22 side of this concavoconvex surface forming substrate 21 and a substrate 1 formed of non-alkali glass (1737, manufactured by Corning, Inc) having a thickness of 0.7 mm, an uncured transparent ultraviolet ray curing resin composition was sandwiched and laminated, and this was exposed to ultraviolet rays from the substrate 1 side so that the ultraviolet ray curing resin composition was cured. Thereafter, the concavoconvex surface forming substrate 21 was separated so that a concavoconvex surface 2 having a convex-shaped structure with a line width of 10 μm, a length of 50 μm and a height of 1.5 μm was formed on the substrate 1 (FIG. 10A).

An Al thin film 23 having a thickness of 100 nm was formed over the entire surface of the resulting concavoconvex surface 2 by using a sputtering method. Thereafter, a negative type photoresist (trade name: "THMR-iP", manufactured by Tokyo Ohka Kogyo Co., Ltd.) was coated thereto by using a spinner to form a negative type photoresist film 24' having a thickness of 2 μm with a flattened upper surface (FIG. 10B).

The previously used concavoconvex surface forming substrate 21 was aligned on the negative type photoresist film 24' at the same position as the position on the glass substrate at the time of forming the concavoconvex pattern, and made closely contacted therewith so that the side of the pattern 22 was made in contact with the negative type photoresist film 24', and this was exposed to ultraviolet rays 27 from the concavoconvex surface forming substrate 21 side (FIG. 10C).

After the exposing, this was developed by using a developing solution so that the negative type photoresist film 24' was removed except the film 24' located on the convex portions corresponding to the exposed portions; thus, the Al thin film 23 was bared on the concave portion. Then, the Al thin film 23 was subjected to an etching by using a mixed acid (mixture of nitric acid and phosphoric acid) so that the Al thin film 23 on the convex portions was allowed to be remained as a gate electrode 35, with only the Al thin film 23 on the concave portion being removed (FIG. 10D). Thereafter, the resist film 24' was separated (FIG. 1E).

Figure 10F:
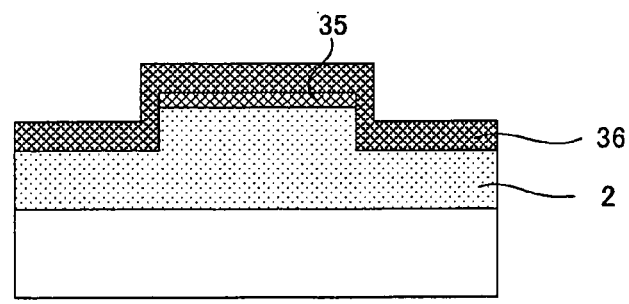

Thereafter, a SiO$_2$ thin film was formed with a thickness of 100 nm by using a reactive sputtering method so that a gate insulating film 36 was formed (FIG. 10F).

Figure 10G:
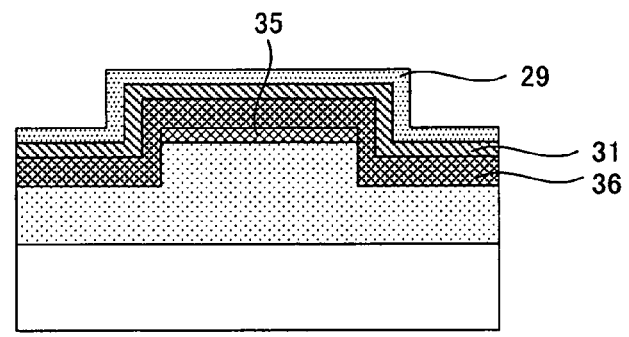

Over the entire surface of the substrate 1, an amorphous silicon thin film 31 containing no impurities was formed with a thickness of 50 nm by sputtering method using a silicon target containing no impurities. Next, by using a silicon target doped with impurities, an impurity containing amorphous silicon thin film 29 with a thickness of 30 nm was formed on the amorphous silicon thin film 31 containing no impurities (FIG. 10G).

Next, a positive type photoresist (trade name: "OFPR800", manufactured by Tokyo Ohka Kogyo Co., Ltd.) was coated thereto by using a spinner to form a positive type photoresist film 24 having a thickness of 2 μm with a flattened upper surface.

Figure 10H:
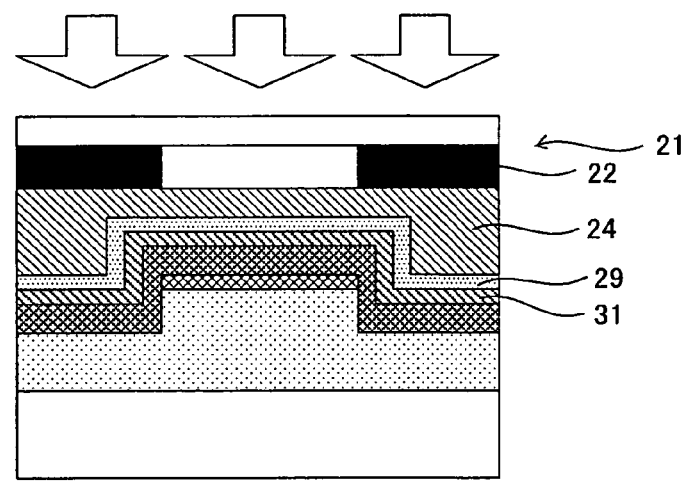

The previously used concavoconvex surface forming substrate 21 was aligned on the positive type photoresist film 24 at the same position as the position on the glass substrate at the time of forming the concavoconvex surface 2, and made closely contacted therewith so that the side of the pattern 22 was made in contact with the positive type photoresist film 24, and this was exposed to ultraviolet rays 27 from the concavoconvex surface forming substrate 21 side (FIG. 10H). After the exposing, this was developed by using a developing solution so that the positive type photoresist film 24 located on the convex portions corresponding to the exposed portions was removed; thus, the impurity containing amorphous silicon thin film 29 was bared.

Figure 10I:
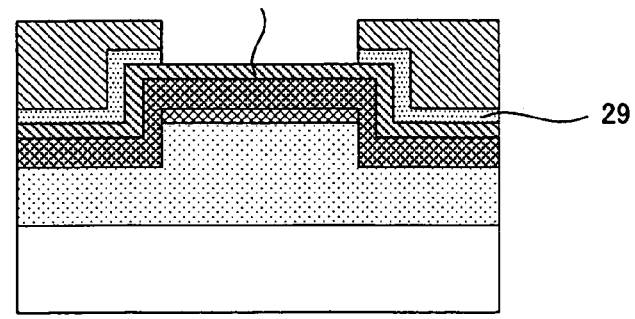
Figure 10J:
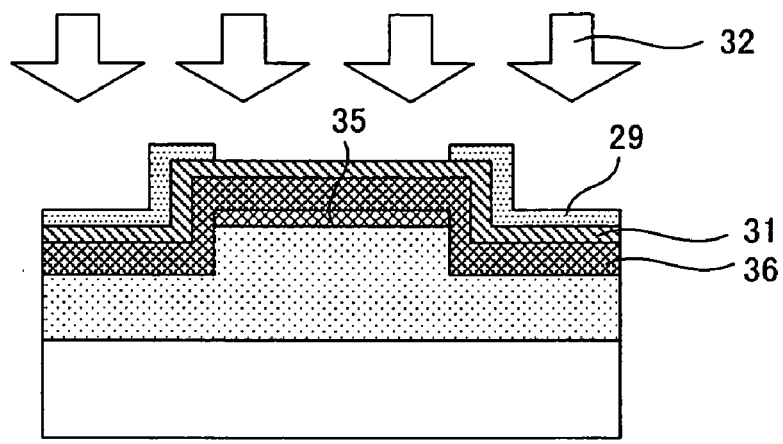

The impurity containing amorphous silicon 29 was etched by a dry etching device so that the impurity containing amorphous silicon thin film 29 on the convex portions was removed and the amorphous silicon thin film 31 that had not been doped was bared (FIG. 10I).

Figure 10K:
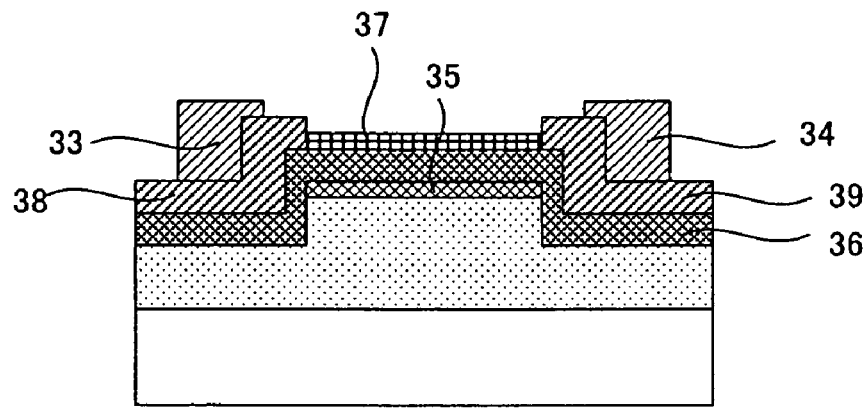

Thereafter, a laser annealing process was carried out by using a XeCl excimer laser 32 having a predetermined power (FIG. 10J) to crystallize the amorphous silicon so that a polysilicon thin film 37 was formed (FIG. 10K). Here, with respect to the impurity containing amorphous silicon thin film 29 and the amorphous silicon thin film 31 containing no impurities, upon crystallization, the impurities in the impurity containing amorphous silicon thin film 29 were diffused in the amorphous silicon thin film 31 containing no impurities, and these two films are further crystallized. These laminated silicon thin film portions were formed as the low resistance source side diffusion layer 38 and the drain side diffusion layer 39. Moreover, the impurities were activated simultaneously due to heat upon crystallization.

Thereafter, an aluminum (Al) film having a thickness of 500 nm was deposited and patterned on the thin films of the source side diffusion layer 38 and the drain side diffusion layer 39 to form a source electrode 33 and a drain electrode 34, thereby providing a thin-film transistor (TFT)(FIG. 10K).

The present invention is not limited to the above mentioned embodiments. The above embodiments are merely examples, and whatever having practically the same composition and exerting similar functional effect to the technical ideas described in the claims of the present invention are included in the technical scope of the present invention.

What is claimed is:

1. A thin-film transistor formed on a substrate with a concavoconvex surface, on which:
    a source electrode and a drain electrode are formed on adjacent convex portions of the concavoconvex surface; and
    a semiconductor channel layer and a gate electrode are formed on a concave area between the convex portions;
    wherein electric current between the source electrode and the drain electrode formed on the adjacent convex portions is controlled by voltage of the gate electrode formed on the concave area located between the source electrode and the drain electrode.

2. The thin-film transistor according to claim 1, wherein the concave area has a structure in which a gate electrode, a gate insulating film and a semiconductor channel layer are laminated on a bottom surface of the concave portion in this order.

3. The thin-film transistor according to claim 1, wherein the concave area has a structure in which a semiconductor channel layer, a gate insulating film and a gate electrode are laminated on the bottom surface of the concave portion in this order.

4. A thin-film transistor formed on a substrate with a concavoconvex surface, on which:
   either one of a source electrode or a drain electrode is formed on a top surface of the convex portion of the concavoconvex surface, wherein the concavoconvex surface is formed of a curing resin;
   a semiconductor channel layer and a gate electrode are formed on a side surface area connecting to the top surface of the convex portion; and
   remaining one of the source electrode or the drain electrode is formed on a bottom surface of a concave portion connecting to the side surface area of the convex portion.

5. A thin-film transistor formed on a substrate with a concavoconvex surface, on which:
   a semiconductor channel layer, a gate insulating film and a gate electrode are laminated on the convex portion of the concavoconvex surface in this order; and
   a source electrode and a drain electrode are respectively formed on bottom surfaces of both sides of the convex portion.

6. The thin-film transistor according to claim 1, wherein the concavoconvex surface is formed of a curing resin.

7. The thin-film transistor according to claim 5, wherein the concavoconvex surface is formed of a curing resin.

8. The thin-film transistor according to claim 1, wherein the semiconductor constituting the thin-film transistor is formed of polycrystal silicon or an organic semiconductor material.

9. The thin-film transistor according to claim 4, wherein the semiconductor constituting the thin-film transistor is formed of polycrystal silicon or an organic semiconductor material.

10. The thin-film transistor according to claim 5, wherein the semiconductor constituting the thin-film transistor is formed of polycrystal silicon or an organic semiconductor material.

11. The thin-film transistor according to claim 1, wherein the substrate is formed of a glass material, a plastic material and a composite material thereof.

12. The thin-film transistor according to claim 4, wherein the substrate is formed of a glass material, a plastic material and a composite material thereof.

13. The thin-film transistor according to claim 5, wherein the substrate is formed of a glass material, a plastic material and a composite material thereof.

* * * * *